(12) United States Patent
Horikoshi

(10) Patent No.: US 7,352,041 B2
(45) Date of Patent: Apr. 1, 2008

(54) MAGNETIC MEMORY DEVICE

(75) Inventor: Hiroshi Horikoshi, Kanagawa (JP)

(73) Assignee: Sony Corporation (JP)

( * ) Notice: Subject to any disclaimer, the term of this patent is extended or adjusted under 35 U.S.C. 154(b) by 134 days.

(21) Appl. No.: 10/919,337

(22) Filed: Aug. 17, 2004

(65) Prior Publication Data

US 2005/0052938 A1   Mar. 10, 2005

(30) Foreign Application Priority Data

Aug. 21, 2003 (JP) ............................ P2003-297593

(51) Int. Cl.
*H01L 29/82* (2006.01)

(52) U.S. Cl. ..................................... 257/421

(58) Field of Classification Search ........ 257/E21.665, 257/421; 365/232

See application file for complete search history.

(56) References Cited

U.S. PATENT DOCUMENTS

| 6,153,443 | A | 11/2000 | Durlam et al. |
| 6,174,737 | B1 | 1/2001 | Durlam et al. |
| 6,943,038 | B2 * | 9/2005 | Meixner et al. ................ 438/3 |
| 2003/0151079 | A1 | 8/2003 | Jones et al. |
| 2004/0156232 | A1 | 8/2004 | Saito et al. |
| 2005/0009212 | A1 * | 1/2005 | Grynkewich et al. .......... 438/3 |

FOREIGN PATENT DOCUMENTS

| EP | 2003209226 | 7/2003 |
| JP | 2003-297593 | 10/2003 |

OTHER PUBLICATIONS

French Search Report Oct. 21, 2005.
Wang et al., IEEE Trans. Magn. 33 (1997), pp. 4,498-4,512.
ISSCC Digest of Technical Papers, pp. 128-129, Feb. 2000.

* cited by examiner

*Primary Examiner*—Kiesha L Rose
(74) *Attorney, Agent, or Firm*—Rader Fishman & Grauer PLLC; Ronald P. Kananen

(57) ABSTRACT

A magnetic memory device and a method of manufacturing the same, which are advantageous not only in that both the improvement of storage sensitivity and the reduction of power consumption can be achieved, but also in that a buried wiring having low resistance and high reliability can be formed in reduced time in a stable manner. Soft magnetic material layers forming the cladding structure of a word line and a bit line constituting an MRAM are formed by electroless plating, and the soft magnetic material layers are formed around main wirings (especially copper) of the word line and bit line so that the soft magnetic material layers individually have a uniform, satisfactory thickness, and further they are deposited with improved uniformity on the surface with which the electroless plating solution is in contact, and therefore the uniformity of cladding is improved at not only the bottom surface but also the sidewall of a wiring trench.

4 Claims, 26 Drawing Sheets

| PALLADIUM SULFATE | 10ppm |
|---|---|
| TEMPERATURE | 20°C |
| pH | 1.0~1.1 |

(B)

| NICKEL SULFATE | 0.08 mol/l |
|---|---|
| IRON SULFATE | 0.02 mol/l |
| AMMONIUM CITRATE | 0.1 mol/l |
| AMMONIUM SULFATE | 0.3 mol/l |
| DIMETHYLAMINEBORANE | 0.03mol/l |
| TMAH | pH ADJUSTMENT |
| TEMPERATURE | 70°C |
| pH | 9.0~9.1 |

(A)

(B)

(C)

DIFFUSION BARRIER PROPERTIES

HARD MAGNETIZATION AXIS
EASY MAGNETIZATION AXIS

MAGNETIC FIELD RESPONSE PROPERTIES UPON WRITING ON MRAM

MAGNETIC FIELD HeA IN THE DIRECTION OF EASY MAGNETIZATION AXIS

MAGNETIC MEMORY DEVICE

CROSS REFERENCE TO RELATED APPLICATIONS

The present document is based on Japanese Priority Application JP2003-297593 filed to the Japanese Patent Office on Aug. 21, 2003, the content of which being incorporated herein by reference to the extent permitted by law.

BACKGROUND OF THE INVENTION

1. Field of the Invention

The present invention relates to a magnetic storage device and a method of manufacturing the same. More particularly, it relates to a nonvolatile magnetic storage device which stores information by utilizing a change in resistance caused by changing of the direction of spin of a ferromagnetic material to parallel or non-parallel, and a method of manufacturing the magnetic storage device.

2. Related Art

As information communication machines and apparatuses, especially personal compact apparatuses, such as portable terminals become increasingly popular, there are demands for devices of higher performance, such as memory elements and logic elements of higher degree of integration, higher speed, and lower power consumption. Particularly, a nonvolatile memory is considered indispensable in the so-called "ubiquitous era".

For example, even if power supply depletion or failure occurs or disconnection of a server and a network occurs due to unexpected reasons, a nonvolatile memory can protect important personal information, for example. In addition, the increase of density and capacity of the nonvolatile memory is more important as a technology for substituting hard disks or optical/magneto-optical disks which fundamentally cannot be downsized, due to the presence of moving parts, etc.

In addition, recently available portable machines are designed so that a non-operating circuit block is maintained in a standby state to reduce the power consumption to a lowest level as possible, and the waste of power consumption and memory can be avoided if a nonvolatile memory capable of serving as both a high speed network memory and a large storage capacity memory can be realized. Further, if a high-speed large-capacity nonvolatile memory can be realized, a function can be realized such that a machine or apparatus is operable in the instant it is turned on, i.e., a so-called "instant-on" function becomes available.

Examples of nonvolatile memories include a flash memory using a semiconductor and an FRAM (ferroelectric random access memory) using a ferroelectric material. However, flash memories have a disadvantage in that the write speed is as low as the order of microsecond. On the other hand, with respect to the FRAM, problems have been pointed out such that the number of allowable rewritings is $10^{12}$ to $10^{14}$ which is not sufficient to completely replace the existing memory by an SRAM (static random access memory) or a DRAM (dynamic random access memory), and that micro-fabrication of a ferroelectric capacitor is difficult to realize.

A magnetic memory called MRAM described in Wang et al., IEEE Trans. Magn. 33 (1997), 4,498, for example, has been catching attention as a prospective nonvolatile memory which does not present the above-mentioned problems and which operates at high speed, having a large storage capacity (increased degree of integration) and lower power consumption, and, especially as the properties of TMR (tunnel magneto resistance) materials have improved. The MRAM is a semiconductor magnetic memory utilizing a magneto resistance effect based on the spin-dependent conduction phenomenon specific to nonmagnetic materials, and is a nonvolatile memory which can keep storage without supplying electric power from the outside.

In addition, the MRAM has a simple structure, it is easy to increase its degree of integration and it records data by utilizing rotation of a magnetic moment to therefore have higher endurance. It is expected that the access time of an MRAM is very fast and it has already been reported in R. Scheuerlein et al, ISSCC Digest of Technical Papers, pp. 128-129, February 2000 that the MRAM can be operated at 100 MHz. Recently, as reported in k. Inomata, Abstracts 18aA-1 of The 26th Annual Conference on Magnetics in Japan, and the like, the MRAM has been seen as a prospective main nonvolatile memory of the next generation.

A further description of the MRAM is provided in FIG. 9, in which a TMR element 10 serving as a memory element of a memory cell of MRAM includes a storage layer 2 in which the magnetization turns relatively easily, and magnetized pinned layers 4, 6, which are formed on a supporting substrate 9.

The magnetized pinned layer includes two magnetized pinned layers, i.e., a first magnetized pinned layer 4 and a second magnetized pinned layer 6, and between them is disposed a conductive layer 5 through which these magnetic layers are antiferromagnetically bound. In the storage layer 2 and magnetized pinned layers 4, 6, a ferromagnetic material including nickel, iron, or cobalt, or an alloy thereof is used, and, as a material for the conductive layer 5, ruthenium, copper, chromium, gold, silver, or the like can be used. The second magnetized pinned layer 6 is in contact with an antiferromagnetic material layer 7, and the exchange interaction between these layers causes the second magnetized pinned layer 6 to have strong magnetic anisotropy in one direction. As a material for the antiferromagnetic material layer 7, a manganese alloy with iron, nickel, platinum, iridium, or rhodium, or cobalt or nickel oxide can be used.

A tunnel barrier layer 3 of an insulator including an oxide or nitride of aluminum, magnesium, silicon, or the like is disposed between the storage layer 2 and the first magnetized pinned layer 4 as magnetic layers, and breaks the magnetic binding between the storage layer 2 and the magnetized pinned layer 4 and permits a tunnel current to flow. The magnetic layers and conductive layers are formed mainly by a sputtering method, but the tunnel barrier layer 3 can be obtained by oxidizing or nitriding a metal film formed by sputtering. A topcoat layer 1 has roles in preventing mutual diffusion between the TMR element 10 and the wiring connected to the TMR element, lowering the contact resistance, and preventing oxidation of the storage layer 2, and, in general, a material, such as Cu, Ta, or TiN, can be used. An undercoat electrode layer 8 is used for connecting a switching element connected in series to the TMR element. The undercoat layer 8 may serve as the antiferromagnetic material layer 7.

In the thus constructed memory cell, a change of the tunnel current caused by a magneto resistance effect is detected to read information as described below, and the effect depends on the relative direction of magnetization of the storage layer and the magnetized pinned layer.

FIG. 17 is an enlarged perspective view schematically showing part of a generic MRAM. Here, for simplifying the drawing, a read-out circuit portion is not shown, and, for example, the MRAM includes nine memory cells, and has bit lines 11 and word lines 12 for write, which cross one another. At each crossing point is disposed the TMR element 10, and, in writing on the TMR element 10, a current is applied to the bit line 11 and word line 12 for write, and a composite magnetic field of the magnetic fields generated from the above lines changes the direction of magnetization of the storage layer 2 in the TMR element 10 at the crossing point of the bit line 11 and the word line 12 for write to be parallel or non-parallel to the magnetized pinned layer, thus achieving writing.

FIG. 18 schematically shows the cross-section of a memory cell, and, for example, an n-type field effect transistor 19 for read-out including a gate insulating film 15 formed in the p-type well region formed in a p-type silicon semiconductor substrate 13, a gate electrode 16, a source region 17, and a drain region 18 is disposed, and the word line 12 for write, the TMR element 10, and the bit line 11 are disposed on the transistor. To the source region 17 is connected a sense line 21 through a source electrode 20. The field effect transistor 19 serves as a switching element for read-out, and a wiring 22 for read-out drawn from a portion between the word line 12 and the TMR element 10 is connected to the drain region 18 through a drain electrode 23. The transistor 19 may be an n-type or p-type field effect transistor, but, instead, various switching elements, such as a diode, a bipolar transistor, and a MESFET (metal semiconductor field effect transistor), can be used.

FIG. 19 is an equivalent circuit diagram of an MRAM, and, for example, it includes six memory cells, and has bit lines 11 and word lines 12 for write, which cross one another, and, at the crossing point of these write lines, it has a memory element 10, and a field effect transistor 19 and a sense line 21 which are connected to the memory element 10 to select an element upon reading-out. The sense line 21 is connected to a sense amplifier 23 to detect information stored. In the figure, numeral 24 designates a word line current driving circuit for bidirectional write, and numeral 25 designates a bit line current driving circuit.

FIG. 20 is an asteroid curve showing the write conditions of MRAM, and indicates a threshold for inversion of the direction of magnetization of the storage layer by the applied magnetic field $H_{EA}$ in the direction of easy magnetization axis and magnetic field $H_{HA}$ in the direction of hard magnetization axis. When a composite magnetic field vector corresponding to the outside of the asteroid curve is generated, magnetic field inversion is caused, but a composite magnetic field vector of inside of the asteroid curve cannot cause inversion of the cell in one current stable state. In addition, in the cell not at the crossing point of the word line and the bit line through which current is applied, a magnetic field generated solely by the word line or bit line is applied and, when the magnetic field generated is equal to or higher than the inversion magnetic field HK in one direction, the direction of magnetization of the cell not at the crossing point is inverted, and therefore, the element is set so that selective writing on the selected cell is possible only when the composite magnetic field falls within the gray region in the figure.

As described above, in the MRAM, using two write lines, i.e., a bit line and a word line and utilizing the asteroid magnetization inversion properties, writing is generally conducted only on a selected memory cell by inversion of the magnetic spin. The composite magnetization in a single storage region is determined by synthesizing vectors of the magnetic field $H_{EA}$ in the direction of easy magnetization axis and the magnetic field $H_{HA}$ in the direction of hard magnetization axis applied to the storage region. The write current applied to the bit line applies to the cell the magnetic field $H_{EA}$ in the direction of easy magnetization axis, and the current applied to the word line applies to the cell the magnetic field $H_{HA}$ in the direction of hard magnetization axis.

FIG. 21 illustrates the read-out operation of an MRAM. Here, the layer construction of the TMR element 10 is schematically shown, and the above-mentioned magnetized pinned layer is indicated as a single layer 26, and the layers are not shown, excluding the storage layer 2 and the tunnel barrier layer 3.

Specifically, as mentioned above, in information writing, the magnetic spin of the cell is inverted by the composite magnetic field at the crossing point of the bit line 11 and the word line 12 disposed in a matrix form to record information of "1" or "0" according to the direction of the magnetic spin. On the other hand, read-out is achieved utilizing a TMR effect which is an applied form of the magnetoresistance effect, wherein the TMR effect is a phenomenon in which the resistance changes depending on the direction of the magnetic spin, and information of "1" or "0" is detected according to the state of high resistance in which the magnetic spin is non-parallel or the state of low resistance in which the magnetic spin is parallel. The read-out is conducted by permitting a read-out current (tunnel current) between the word line 12 and the bit line 11 and reading the output according the high or low resistance by the sense line 21 through the field effect transistor 19 for read-out.

As mentioned above, differing from a conventional memory function utilizing electrons (electricity), the MRAM is a device using as a memory medium a change of the magnetoresistance caused by changing of the direction of magnetization, which needs to operate the response of changing of the direction of magnetization at a speed equivalent to the speed of the response of the conduction of electrons. The direction of magnetization of the TMR element in the MRAM changes depending on the current which flows a metal wiring. That is, current is applied a wiring to generate a magnetic field around the wiring as a center. The TMR element (hereinafter, frequently referred to as "MRAM element", and also as "MTJ") detects the magnetic field generated, so that the magnetic material in the TMR element is magnetized in the direction linked to the direction of the magnetic field generated from the wiring. The magnetic material magnetized causes a magnetoresistance, and the magnetoresistance is read as a change of voltage or current. It is important that the magnetic field generated is efficiently introduced to the TMR element, and this efficiency is considered to determine the operation speed and sensitivity of the TMR element. Factors for efficiently introducing the magnetic field to the TMR element include: (I) generation of an intense magnetic field; (II) suppression of leakage of the magnetic field; (III) arrangement of the MRAM element in the intense magnetic field portion; (IV) high sensitivity of the MRAM (TMR) element, and the like.

With respect to the factor (I), the intensity of a magnetic field depends on the current density, and, as the current density of a wiring increases, the intensity of the magnetic field increases. The increase of the current density promotes electromigration of the wiring, and hence the use of not an aluminum wiring but a copper wiring prevents the problem. With respect to the factor (III), the problem is solved by arranging a wiring and the MRAM element so that they are close to each other. With respect to the factor (IV), the problem is solved by improving the material and method for forming the MRAM element.

With respect to the factor (II), a detailed explanation is made. Storage in the MRAM is made by rotating the magnetization of the storage layer utilizing an induced magnetic field generated by allowing a current to flow a wiring. However, as the wiring becomes thinner due to the increase of the degree of integration, the critical value of a current which can flow the write line is lowered, so that only a weak magnetic field can be obtained, thus inevitably reducing the coercive force of the storage region. This means that the reliability of the information storage device is lowered. In addition, unlike a light or an electron beam, a magnetic field cannot be focused and this is considered to be the biggest cause of cross talk when the degree of integration is increased. For preventing this, a keeper structure and the like have been proposed (see, for example, U.S. Pat. No. 6,413,788), but they inevitably cause the structure to be complicated. As described above, writing using a current magnetic field has a number of fundamental problems to be solved, and the writing using an induced magnetic field may be a great defect of the future MRAM.

With respect to the factor (II), an attempt is made to solve the problem by a method using a cladding structure in which a wiring portion is covered with a soft magnetic material (see, for example, Japanese Patent Application Laid-Open No. 2002-246566). A general cladding structure formed from a buried wiring and its effects are described with reference to FIG. 22.

FIG. 22A schematically shows a word line 12 and a bit line 11 including a cladding structure and a TMR element 10 between the wirings, and the write lines 12, 11 having the element 10 disposed therebetween are individually formed by composite structures (cladding structures) including, respectively, nonmagnetic conductors 30, 31 including a conductive material, such as Cu, Al, or an alloy thereof, and soft magnetic materials 32, 33 having high magnetic permeability and covering the nonmagnetic conductors. As a constituent material for the soft magnetic conductors 32, 33, for example, Ni, Fe, Co, or an alloy included mainly of these may be used. Specifically, a Ni—Fe alloy (iron-nickel alloy) called Permalloy is used.

The write lines 11, 12 individually have a cross-section in a substantially rectangular form, and three planes of each write line, excluding the plane on the side of the memory element 10, are covered with the substantially U-shaped soft magnetic conductors 32, 33 and the nonmagnetic conductors 30, 31 are exposed only through the respective surfaces on the side of the memory element 10. Therefore, the exposed surfaces of the nonmagnetic conductors 31, 32 of the write lines 11, 12 face to each other, and the soft magnetic conductors 32, 33 are arranged symmetrically. Further, the write lines 11, 12 are individually formed so that the cross-section width (indicated by A or B in the figure) of the exposed portions of the nonmagnetic conductors 30, 31 on the side of the memory element 10 is equal to or larger than the element width (indicated by a or b in the figure) of the memory element 10.

In the MRAM using the write lines 11, 12 having the above construction, portions of the soft magnetic conductors 32, 33 in the cladding structure transmit a magnetic flux, and therefore magnetic lines of force, which are generally distributed around the write line, converge due to the soft magnetic conductor 32, 33 having high magnetic permeability, so that the magnetic lines of force generated converge on the exposed portions of the nonmagnetic conductors 30, 31, i.e., portion of the memory element 10.

FIG. 22B is an explanatory view illustrating a specific example of the simulation of magnetic lines of force generated around one write line. It is found that, when a write current is applied to the write line in a substantially rectangular form having its three planes covered with the soft magnetic conductors 32, 33 as shown in FIG. 22A, magnetic lines of force generated are not uniformly distributed around the write line but converge on portions of the nonmagnetic conductors 30, 31 due to the magnetic flux transmission of the soft magnetic conductors 32, 33. Specifically, the mathematical simulation indicates that, when the width and thickness of the write lines 11, 12 are individually 0.25 μm and a current of 1 mA is applied to the write lines, a magnetic field of about 85 Oe is generated in the center portion of the memory element 10 facing the nonmagnetic conductors 30, 31.

By contrast, when the write line is constituted only by a nonmagnetic conductor, magnetic lines of force generated are uniformly distributed around the write line, and therefore, when a current of 1 mA is applied to the write line having a width and a thickness of 0.25 μm, only a magnetic field as small as about 23 Oe is obtained in the center portion of the memory element 10.

Therefore, by using the write lines 11, 12 having the above cladding structure, a magnetic field for write can be generated more efficiently than the conventional magnetic lines of force uniformly distributed, so that inversion of the direction of magnetization of the memory element 10 can be achieved by a smaller current.

For efficiently obtaining the above effect, it is desired that the magnetic permeability of the soft magnetic conductors 32, 33 covering the magnetic conductors 30, 31 of the write lines 11, 12 is generally 10 or more. It has been confirmed that, when the thickness of the soft magnetic conductors covering the magnetic conductors is 0.01 μm or more, an effect to increase the magnetic field generated can be obtained.

If the three planes of the substantially rectangular form are covered with the soft magnetic conductors 32, 33, a larger number of magnetic lines of force converge on the inside portions (portions of the nonmagnetic conductors 30, 31) of the both edge portions of the substantially U-shaped soft magnetic conductors 32, 33. For this reason, when the cross-section width A, B of the nonmagnetic conductors 30, 31 is equal to or larger than the element width a, b of the memory element 10, the width of the information storage layer 2 of the memory element 10 is smaller than the distance between the both edge portions of the soft magnetic conductors 32, 33, so that the information storage layer 2 is disposed between the edge portions, thus making it possible to efficiently focus the generated magnetic lines of force on the information storage layer 2.

As mentioned above, in the MRAM shown in FIG. 22, the write lines 11, 12 individually have a composite structure including the nonmagnetic conductors 30, 31 and the soft magnetic conductors 32, 33, and hence, if current is applied to the write lines, lines of magnetic force are generated and converge on portions of the nonmagnetic conductors, so that information writing on the memory element 10 can be achieved by a write current smaller than the write current conventionally required. Therefore, the write current can be reduced without lowering the coercive force of the memory element, making it easy to realize shrinking of the MRAM (increase of the density) by scaling-down the write line driving circuit or the like, reduction of power consumption, improvement of reliability by suppressing wiring breakage due to electromigration in the write line, and the like.

Next, a method (damascene method) for forming the above-mentioned cladding structure from a buried wiring is described below. Examples of wirings using the cladding structure include a word line (wiring on the lower side of the TMR element) and a bit line (wiring on the upper side of the TMR element), and a word line having a simple structure is mainly described here. (A bit line can be formed in a similar way.)

FIGS. 23A to 27B show a method for forming a cladding structure of a word line (or a bit line) from a trench wiring. In these figures, only wiring portions are shown, and a substrate, a transistor, and the like under the word line are not shown. (An undercoat wiring connected to the drain region of a transistor is actually present under the drain electrode wiring for read-out formed simultaneously with the word line, but this is not shown in the figures).

First, as shown in FIG. 23A, a trench 40 to be plugged with a wiring is formed in an insulating layer 41, and then, as shown in FIG. 23B, a first diffusion barrier layer 42 for word line and read-out line is formed on the entire surface including the wiring trench 40. The first diffusion barrier layer 42 is deposited over a bottom surface 43 and a sidewall 44 of the wiring trench 40, and a field portion 45, excluding the wiring portion (namely, the entire surface).

As a constituent material for the first diffusion barrier layer 42, tantalum (Ta), tantalum nitride (TaN), titanium (Ti), titanium nitride (TiN), tungsten nitride (WN), zirconium nitride (ZrN) and the like, is used. In deposition of this layer, a sputtering method is widely used, but other examples include a chemical vapor deposition (hereinafter, referred to as "CVD") method and an ALD (atomic layer deposition) method, and the method for deposition is selected depending on the form and size of the wiring trench in which the barrier metal layer is formed.

Next, as shown in FIG. 23C, a soft magnetic material layer 33 is deposited on the first diffusion barrier layer 42. As a constituent material for the soft magnetic material layer 33, nickel-iron Permalloy, cobalt-iron, or the like is used, and, in deposition for the layer, a sputtering method is generally used.

Then, as shown in FIG. 23D, a second diffusion barrier layer 4 and 6 is formed on the soft magnetic material layer 33. In this case, the first diffusion barrier layer 4 and 6 is formed for preventing the constituent ingredient of the soft magnetic material layer 33 from diffusing into the adjacent insulating film, e.g., insulating layer 41, and the second diffusion barrier layer 4 and 6 is formed for preventing mutual diffusion between the soft magnetic material layer 33 and the below-described buried copper (Cu) wiring. The constituent material and deposition method for the second diffusion barrier layer 4 and 6 are the same as those for the first diffusion barrier layer 42.

Then, as shown in FIG. 23E, a seed layer 47 for the below-described plugging the wiring trench 40 with copper is deposited. As described below, electro-plating of copper (Cu) is widely used in plugging the wiring trench 40, and the seed layer 47 serves as a growth nucleus for the initial deposition in the electro-plating and an electrode for electrical conduction. Therefore, a material similar to the material deposited by electro-plating is generally used. In deposition for the seed layer 47, a sputtering method or a CVD method is used.

Then, as shown in FIG. 24A, using the seed layer 47 as a growth nucleus and an electrode, a copper (Cu) layer 31A constituting wiring is deposited by electro-plating on the entire surface including the wiring trench 40. In this case, as mentioned above, electro-plating is generally used, but electroless plating or CVD method may be used.

Then, as shown in FIG. 24B, the copper (Cu) layer 31A (including the seed layer 47), second diffusion barrier layer 4 and 6, soft magnetic material layer 33, and first diffusion barrier layer 42 deposited on the portion excluding the wiring trench 40 are removed so that copper constituting the wiring remains only in the wiring trench 40 as a nonmagnetic conductor 31 for the word line 12 and a nonmagnetic conductor 51 for the read-out line 23 and the second diffusion barrier layer 4 and 6, soft magnetic material layer 33, and first diffusion barrier layer 42 remain around the above conductors. In this step, generally, a chemical mechanical polishing method (CMP; hereinafter, referred to as "CMP") is used.

Here, as shown in FIG. 22A, the soft magnetic material layer 33 is present in the wiring trench 40 so as to cover the copper layers 31, 51 as wiring, and this structure is generally called a cladding structure or yoke structure. The word line (wiring on the lower side of the TMR or MRAM element) is described here, and on the word line is disposed the MRAM element through the insulating layer 48. The purpose of the cladding structure is to effectively supply the magnetic field induced by a current fed to the wiring (wiring in the cladding structure; hereinafter, frequently referred to as "cladding wiring") to the TMR element, and therefore no soft magnetic material layer is formed on the surface of the cladding wiring. (here, the upper surface of the wiring) which faces the TMR element.

Next, as shown in FIG. 24C, for preventing the wiring copper 31, 51 from diffusing, an insulating film 48 including silicon nitride (SiN), silicon carbide (SiC) or the like for preventing copper diffusion is deposited. On the insulating film, a silicon oxide film ($SiO_2$) (not shown) may be deposited to constitute an interlayer dielectric film together with the insulating film 48, but deposition of the silicon oxide film is not always needed, and the interlayer dielectric film may be formed only from the insulating film 48 for preventing diffusion.

Then, as shown in FIG. 24D, a contact hole 49 for connecting a TMR element and a read-out line 23 is formed in the insulating film 48 by lithography and dry etching, and then, on the entire surface including the contact hole 49, layers of constituent materials for the TMR element are successively deposited by a sputtering method or the like. For example, Ta (undercoat layer) 8, a stacked film 26 including PtMn (antiferromagnetic material layer), CoFe (second magnetized pinned layer), Ru (antiferromagnetic binding layer), and CoFe (first magnetized pinned layer), a tunnel barrier layer 3 including $Al_2O_3$, CoFe-30B (storage layer) 2, and Ta (topcoat layer) 1 are successively deposited.

Then, as shown in FIG. 25A, a portion constituting the TMR element 10 is formed by lithography and dry etching, and then a wiring 60 for connecting the TMR element 10 and the read-out line 23 is formed by lithography and dry etching. The wiring 60 may be including the stacked film 26 and the undercoat layer 8, but the material for the film on the undercoat layer 8 may be arbitrarily changed.

Then, as shown in FIG. 25B, an insulating layer 50 is formed on the entire surface, and then a contact hole 52 is formed in the insulating layer 50 by lithography and dry etching.

Then, as shown in FIG. 25C, a first diffusion barrier layer 53 for bit line is formed on the entire surface including the contact hole 52 and a wiring trench (not shown). As a constituent material for the first diffusion barrier layer 53, tantalum (Ta), tantalum nitride (TaN), titanium (Ti), titanium nitride (TiN), tungsten nitride (WN), zirconium nitride (ZrN), or the like is used. In deposition of this layer, a sputtering method is widely used, and other examples include a CVD method and an ALD method, and the method for deposition is selected depending on the form and size of the contact hole in which the barrier metal layer is formed.

Then, as shown in FIG. 26A, a soft magnetic material layer 54 is deposited on the first diffusion barrier layer 53. As a constituent material for the soft magnetic material layer 54, nickel-iron Permalloy, cobalt-iron, or the like is used, and, in deposition of the layer, a sputtering method is generally used.

Then, as shown in FIG. 26B, only the soft magnetic material layer 54 on the bottom of the contact hole 52 and the bottom of a wiring trench 61 indicated by a virtual line is removed by a method of dry etching, ion milling, or etch back.

Then, as shown in FIG. 26C, a second diffusion barrier layer 55 is formed on the soft magnetic material layer 54. In this case, the first diffusion barrier layer 53 is formed for preventing the constituent ingredient of the soft magnetic material layer 54 from diffusing into the adjacent insulating film, e.g., insulating layer 50, and the second diffusion barrier layer 55 is formed for preventing mutual diffusion between the soft magnetic material layer 54 and the below-described buried copper (Cu) wiring. The constituent material and deposition method for the second diffusion barrier layer 55 are the same as those for the first diffusion barrier layer 53.

Then, a seed layer (not shown) for plugging the wiring trench 61 including the contact hole 52 with copper is deposited in the same manner as shown in FIG. 23E. Electro-plating of copper (Cu) is widely used in plugging, and the seed layer serves as a growth nucleus for the initial deposition in the electro-plating and an electrode for electrical conduction. Therefore, a material similar to the material deposited by electro-plating is generally used. In deposition of the seed layer, a sputtering method or a CVD method is used.

Then, as shown in FIG. 27A, using the seed layer as a growth nucleus and an electrode, a copper (Cu) layer 30A constituting wiring is deposited by electro-plating on the entire surface including the contact hole 52 and wiring trench 61. In this case, as mentioned above, electro-plating is generally used, but electroless plating or CVD method may be used.

Then, as shown in FIG. 27B, the copper (Cu) layer 30A (including the seed layer), second diffusion barrier layer 55, soft magnetic material layer 54, and first diffusion barrier layer 53 deposited on the portion excluding the contact hole 52 and wiring trench 61 are removed so that the copper constituting wiring remains as the nonmagnetic conductor 30 for the bit line 11 only in the contact hole 52 and wiring trench 61 and the second diffusion barrier layer 55, soft magnetic material layer 54, and first diffusion barrier layer 53 remain around the conductor. In this step, CMP is generally used. Then, a diffusion barrier layer 57 similar to the above one is formed on the copper layer 30A by a sputtering method, and then a soft magnetic material layer 56 including the same material as that for the soft magnetic material layer 54 is deposited by a sputtering method so that it is connected to the soft magnetic material layer 54 on the sidewall of the wiring trench, and patterned into a predetermined form, thus forming a soft magnetic material layer 32 covering the copper layer 30 shown in FIG. 22A.

Here, the soft magnetic material layer 32 is present in the contact hole 52 and wiring trench 61 so as to cover the copper layer 30 as wiring, and this structure is generally called a cladding structure or yoke structure. The bit line (wiring on the upper side of the TMR or MRAM element) is described here, and under the bit line is disposed the MRAM element through the insulating layer 50. The purpose of the cladding structure is to effectively supply the magnetic field induced by a current fed to the cladding wiring to the TMR element, and therefore no soft magnetic material layer is formed on the surface of the cladding wiring (here, the lower surface of the wiring) which faces the TMR element.

Thus, an MRAM (TMR) element having the word line 12, read-out line 23, and bit line 11, in which a copper layer, a soft magnetic material layer, and diffusion preventing layers are buried, can be prepared by a damascene method.

In the above-described method, in the steps of FIGS. 23A to 23E and FIGS. 25B to 26C, as mentioned above, sputtering is generally used as a deposition method, and hence the use of a multi-chamber sputtering machine enables successive deposition.

SUMMARY OF THE INVENTION

The sputtering method is a method that permits an advantageous controllability of the film thickness and hence has been widely used in semiconductor processes. Therefore, the sputtering method is used in the above-described formation of the cladding wiring. However, in accordance with the current design rule scaled-down, a problem of unsatisfactory cladding in the sputtering surfaces.

Particularly, for sizes of a quarter of micron or less, the sputtering method has to be inevitably changed as the roadmap for semiconductor indicates.

Examples of sputtering methods include a conventional sputtering method and sputtering methods having improved linearity, such as a long throw method, a collimator method, and a self-ionization method. The conventional sputtering method has a feature such that it deposits a film uniformly on the entire surface of the sidewall and bottom of a hole portion, but the performance is effective only for the form having a hole of several μm or more. The cladding in the conventional sputtering method for a high melting-point metal, such as titanium (Ti) or tungsten (W), is relatively improved, and hence the conventional sputtering method has been used in the half micron rule or larger for forming a film of the above metal used as a thin film, such as a barrier metal.

However, in the quarter of micron size or less, the conventional sputtering method has limitations, and therefore adoption of a high-linearity sputtering method has been started in which sputtered particles can reach the bottom of a hole portion. In the high-linearity sputtering method, the linearity is improved and hence effective in improving the cladding at the bottom of a hole portion, but the method enormously sacrifices the cladding at the sidewall of the hole portion, and can realize only deposition of a very thin film on the sidewall.

With respect to the above-mentioned diffusion barrier layers 42, 46, 53, 55, the thickness which can secure the barrier properties is as small as several nm, and therefore the above sputtering method having improved linearity can deal with a film of a thickness of a quarter of micron or less. On the other hand, as mentioned above, the soft magnetic material layers 33, 54 covering the wiring copper are the keys to allow the cladding wiring to effectively exhibit cladding properties. The role of the soft magnetic material layer is to converge the induced magnetic field, and important factors for the convergence effect include not only the magnetic properties of the material for the soft magnetic material layer but also the thickness of the layer. If a satisfactory thickness is not assured, leakage of the magnetic field occurs. It is considered that the soft magnetic material layer having a magnetic flux convergence effect has a thickness of several tens nm or more.

As mentioned above, formation of the soft magnetic material layer having a satisfactory thickness on the sidewall of a scaled-down hole portion largely affects the magnetic field convergence effect, and therefore the conventional sputtering method in which sputtered particles cannot enter the fine hole or the high-linearity sputtering method in which only a thin film can be deposited on the sidewall of a hole portion causes difficulty in the formation of the soft magnetic material layer.

FIG. 28 is a photomicrograph showing one example of deposition of a film in a wiring trench by a conventional sputtering method (corresponding to the steps shown in FIGS. 23C to 23E).

As seen in FIG. 28, it seems that deposition of a film having a satisfactory thickness on the sidewall of the wiring trench is accomplished by increasing the thickness. However, the increase of the thickness considerably adversely affects removal of the excess wiring materials deposited on the portion excluding the wiring portion in the above-mentioned process of FIG. 24B, and overhang is caused around the wiring trench (this is similar to the process of FIG. 27B).

Although details are not shown in FIG. 24B, the process for removing the excess wiring materials generally includes two removing steps. The first step is a step for removing the copper 31A, and the second step is a step for removing the diffusion barrier layer 4 and 6, soft magnetic material layer 33, and diffusion barrier layer 42. In removal of the diffusion barrier layer and soft magnetic material layer, a physical action strongly works. For example, when using CMP which is a general removing process, removal of the diffusion barrier layer and soft magnetic material layer is low in the removing speed and high in the removing polishing pressure, as compared to removal of copper. Therefore, considering the above-mentioned properties of the removing step, the increase of the thickness of the soft magnetic material layer causes mainly the following problems.

(1) The polishing time is prolonged. That is, the throughput is reduced.

(2) Generally, dishing (which means that excess polishing wears the wiring covering too large an area to cause depression) and erosion (which means that high polishing pressure causes the portion of wirings with high density to be scooped out (namely, causes depression as if the wiring portion is scooped out) in CMP are controlled by adjusting the polishing time in the second step, and it is preferred that the treatment is completed in a shorter time. However, the polishing time is prolonged, so that dishing and erosion become further marked.

Thus, the increase of the thickness of the soft magnetic material layer considerably adversely affects the step for removing the excess wiring materials.

It is an object of the present invention to provide a magnetic storage device and a method of manufacturing the same, which are advantageous not only in that both the improvement of storage sensitivity and the reduction of power consumption can be achieved, but also in that a buried wiring having low resistance and high reliability can be stably formed in a shorter time.

Specifically, a preferred embodiment of the present invention is directed to a nonvolatile magnetic storage device which includes: first wiring; magnetoresistive memory element electrically insulated from the first wiring by a first insulating layer, wherein the memory element includes a tunnel insulating layer between ferromagnetic materials; second insulating layer covering the memory element; and a second wiring electrically connected to the memory element, and buried in the second insulating layer in a state in which the second wiring spatially crosses the first wiring through the memory element; the magnetic storage device is characterized in that the first wiring and the second wiring are buried as damascene wiring in a trench formed in an insulating layer, wherein at least a soft magnetic material layer is formed by electroless plating in the trench at an outer periphery portion of the first wiring and/or the second wiring.

Further, another preferred embodiment of the present invention provides a method of manufacturing a nonvolatile magnetic storage device, the process including: forming a first wiring; forming a magnetoresistive memory element electrically insulated from the first wiring by a first insulating layer, wherein the memory element includes a tunnel insulating layer between ferromagnetic materials; forming a second insulating layer covering the memory element; and burying a second wiring in the second insulating layer so that the second wiring is electrically connected to the memory element and spatially crosses the first wiring through the memory element; the method of manufacturing the magnetic storage device is characterized by burying the first wiring and the second wiring as damascene wiring in a trench formed in an insulating layer, wherein at least a soft magnetic material layer is formed by electroless plating in the trench at an outer periphery portion of the first wiring and/or the second wiring.

In the present invention, at least the soft magnetic material layer constituting the cladding structure of the first wiring (word line) and/or the second wiring (bit line) is formed by electroless plating, and therefore the soft magnetic material layer can be formed around the main wiring material (especially copper) in the first and/or second wiring so that the soft magnetic material layer has a uniform, satisfactory thickness. Thus, an induced magnetic field generated at the first and/or second wiring can be efficiently introduced to the memory element, and hence the current fed to the wiring required for generating the magnetic field can be reduced, so that not only can the power consumption of the magnetic storage device be lowered, but also the storage sensitivity can be improved. Therefore, there is no need to reduce the distance between each wiring and the memory element for improving the write efficiency of the first and/or second wiring, making it possible to expand the process margin in formation of the insulating layer therebetween.

In this case, a material having magnetic properties, such as nickel or an alloy thereof, or cobalt or an alloy thereof, can be easily deposited by electroless plating, and, when depositing an alloy film or the like, the composition of the film can be easily changed by controlling the plating solution or plating conditions, thus making it possible to easily obtain the required soft magnetic material properties.

The at least soft magnetic material layer is formed by electroless plating, and therefore it can be deposited with improved uniformity on the surface with which the electroless plating solution is in contact, and the uniformity of cladding is improved at not only the bottom surface but also the sidewall of a wiring trench, so that the soft magnetic material layer formed has a required minimum volume or thickness, making it possible to render the volume of the main wiring material (especially copper) relatively large.

Therefore, the resistance of the wiring is reduced and the effective current density is further lowered, thus improving the wiring reliability including electromigration resistance.

Deposition by electroless plating results in conformal cladding (which means that a film can be deposited uniformly along the underlying surface), and hence the soft magnetic material layer and diffusion barrier layer each having a high resistance to chemical mechanical polishing (CMP) (hard to polish) and having a small thickness can be formed. Therefore, the time required for removing the unnecessary soft magnetic material layer and diffusion barrier layer by polishing can be shortened. Shortening the polishing time improves the throughput and suppresses dishing or erosion of the wiring, advantageously improving the yield of the wiring (wiring resistance, wiring short-circuiting) and the wiring reliability (suppression of reduction of the thickness of the wiring).

Further, overhang caused in the deposition by sputtering as shown in FIG. 28 does not occur, and therefore, in the process for plugging a trench with copper or the like as a wiring material, plugging failure, such as voids or seams, is not caused in the wiring, and hence a stable process can be established. In addition, the form of copper or the like as a main wiring material of the wiring formed is similar to the form of the wiring trench (which does not have a trapezoidal cross-section such that the upper portion of the wiring corresponds to the upper bottom), which form is such that the local stress caused by a thermal stress during the process is reduced, thus improving the resistance to stress migration.

The sputtering machine requires ultra-high vacuum and a large-scale power source, and hence has disadvantages in that the machine cost is high and machine troubles cause long downtime. By contrast, the electroless plating machine requires neither a power source nor a vacuum apparatus, and therefore is advantageous in the cost or TAT (turn-around-time). In addition, the sputtering machine generally conducts a treatment in a single wafer system, whereas, the electroless plating machine can realize a treatment in a batch mode such that a plurality of sheets can be simultaneously treated.

BRIEF DESCRIPTION OF THE DRAWINGS

The above and other objects and features of the preferred embodiments of the present invention will become more apparent to those of ordinary skill in the art from the following detailed description taken in conjunction with the accompanying drawings in which:

FIG. 9A to 9B show tables illustrating an example of the process conditions in the first preferred embodiment of the present invention.

DETAILED DESCRIPTION OF THE PREFERRED EMBODIMENTS OF THE PRESENT INVENTION

Figure 1:
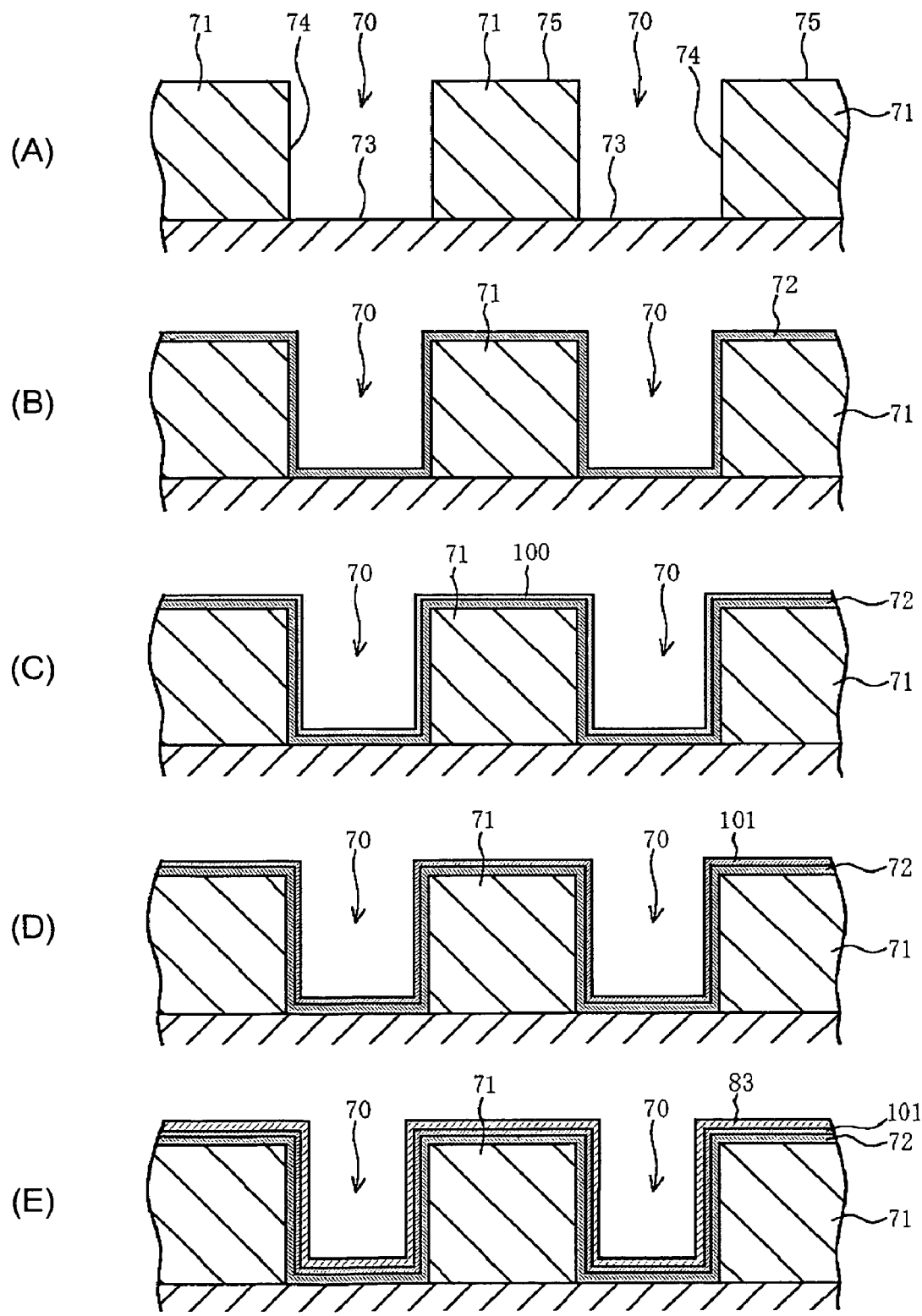
FIG. 1A to 1E show cross-sectional views illustrating successive steps in a process for preparing an MRAM according to the first preferred embodiment of the present invention.
Figure 2:
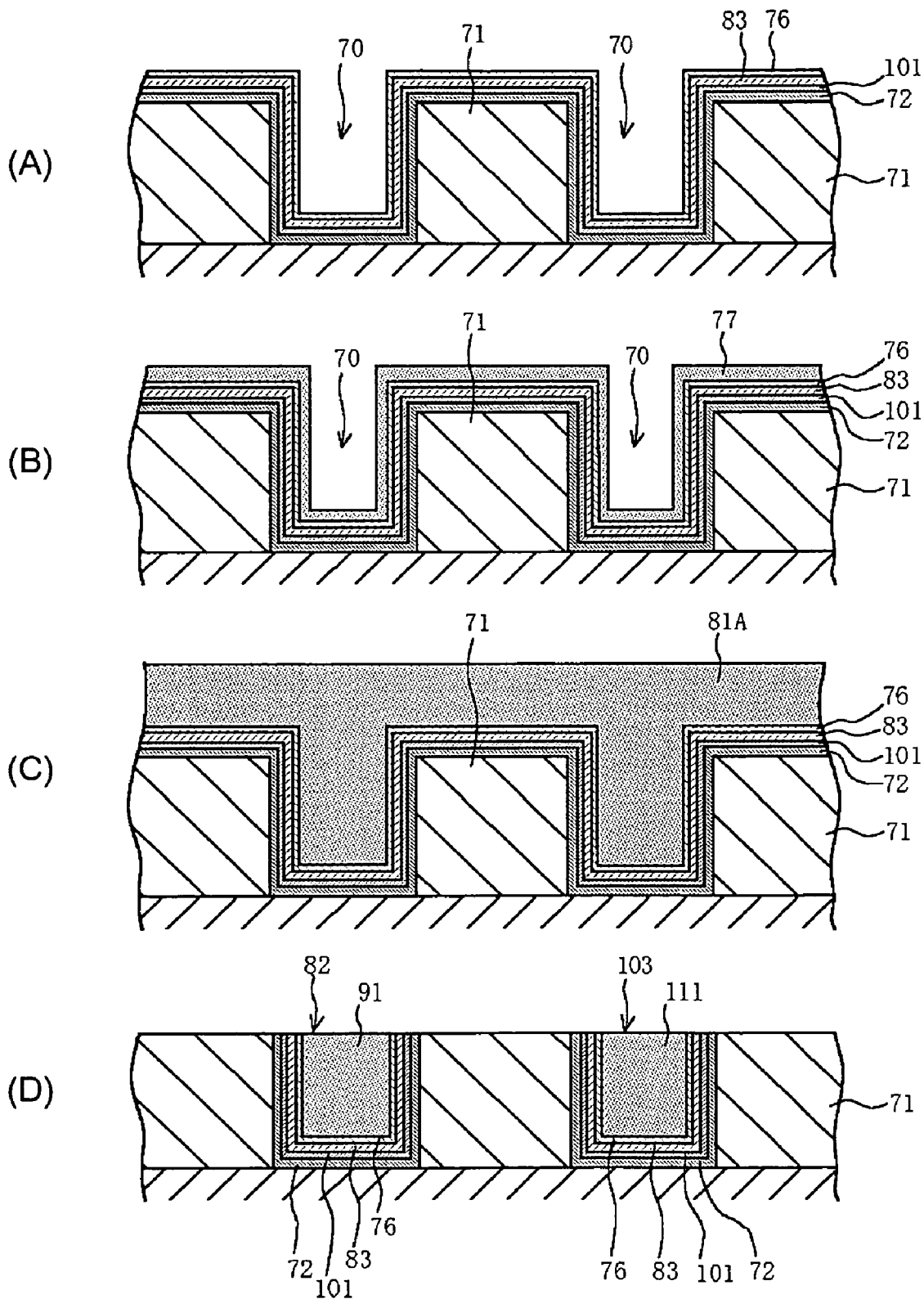
FIG. 2A to 2D show cross-sectional views illustrating the subsequent steps in the process for preparing the MRAM.
Figure 3:
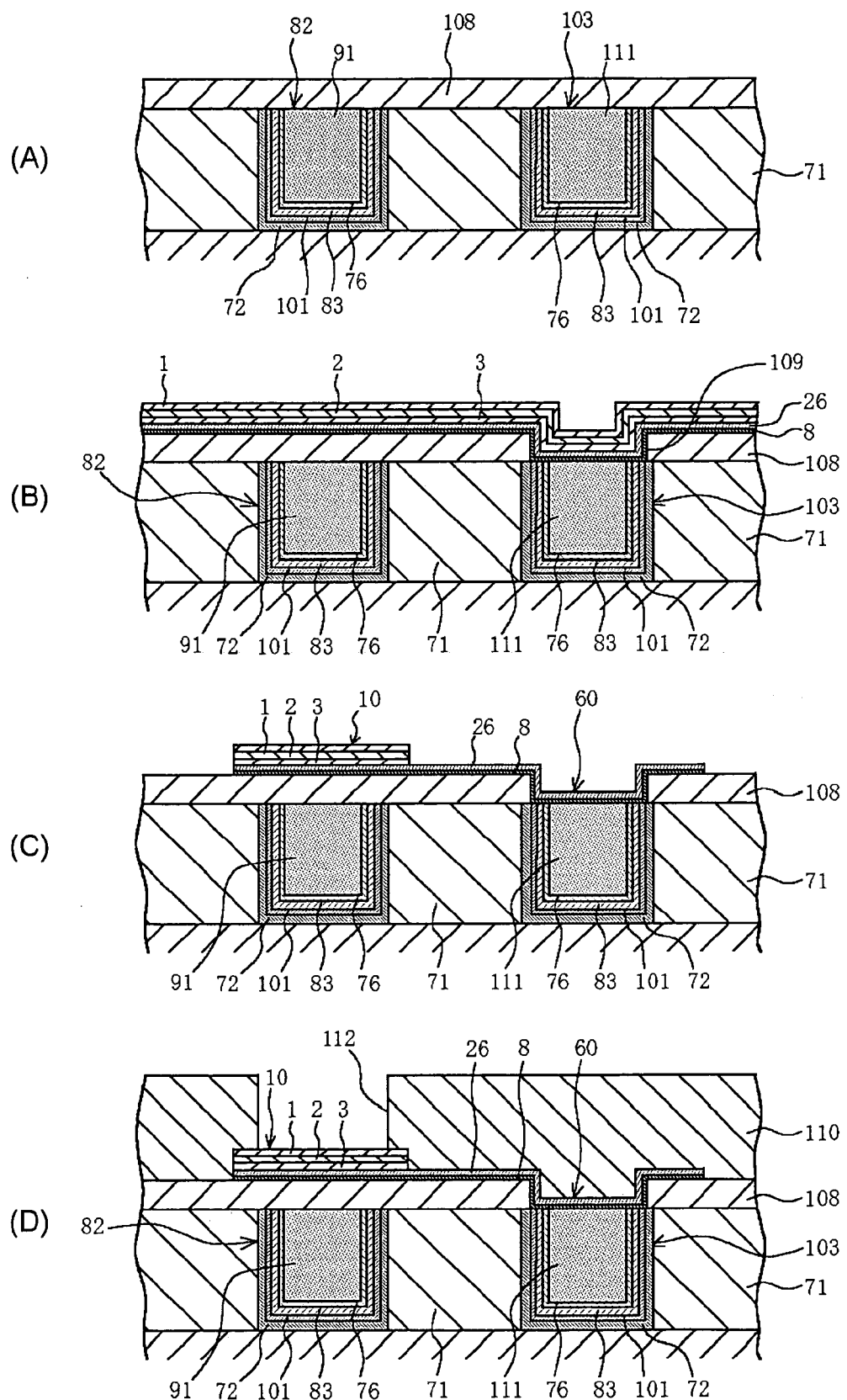
FIG. 3A to 3D show cross-sectional views illustrating the subsequent steps in the process for preparing the MRAM.
Figure 4:
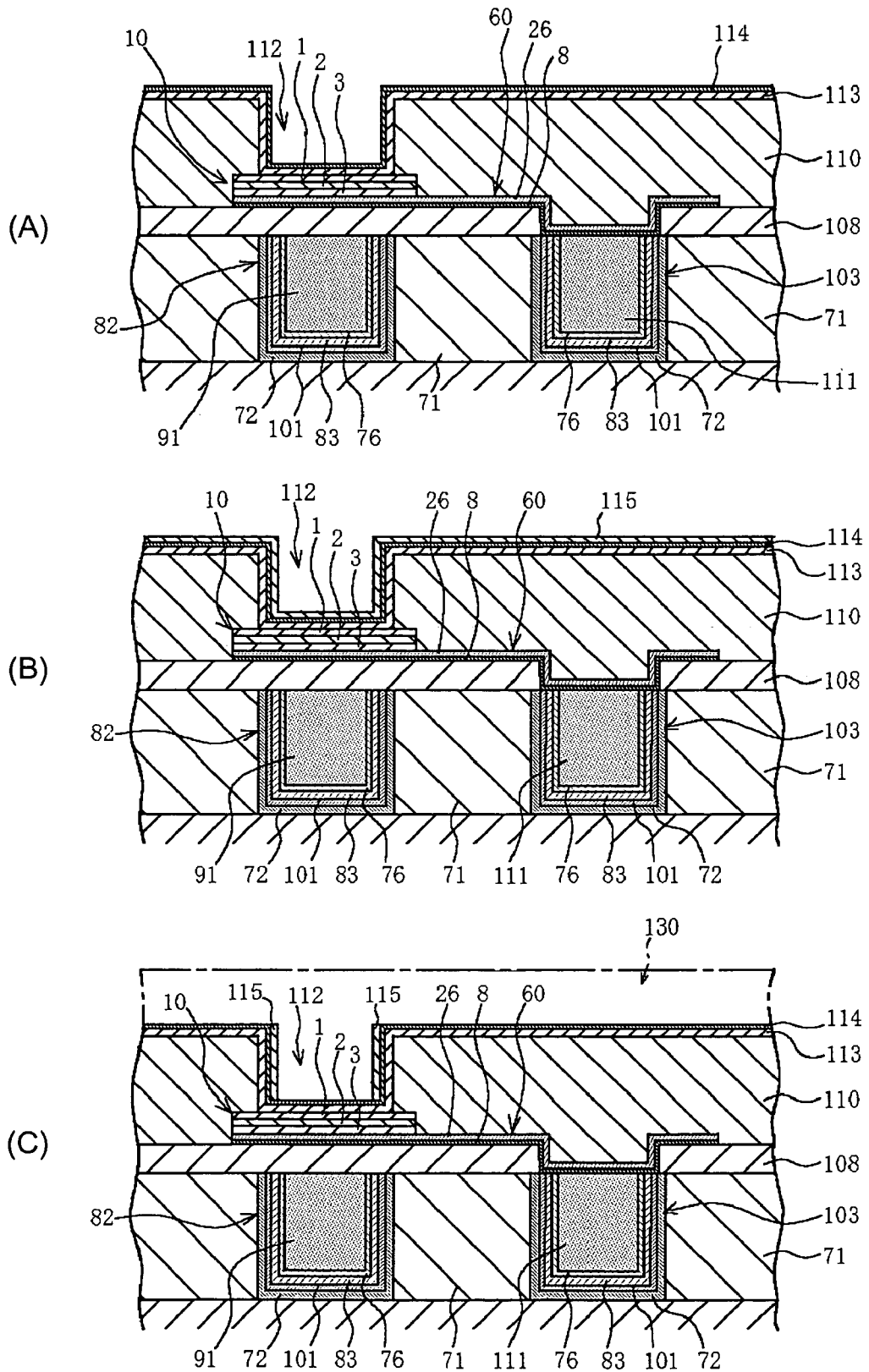
FIG. 4A to 4C show cross-sectional views illustrating the subsequent steps in the process for preparing the MRAM.
Figure 5:
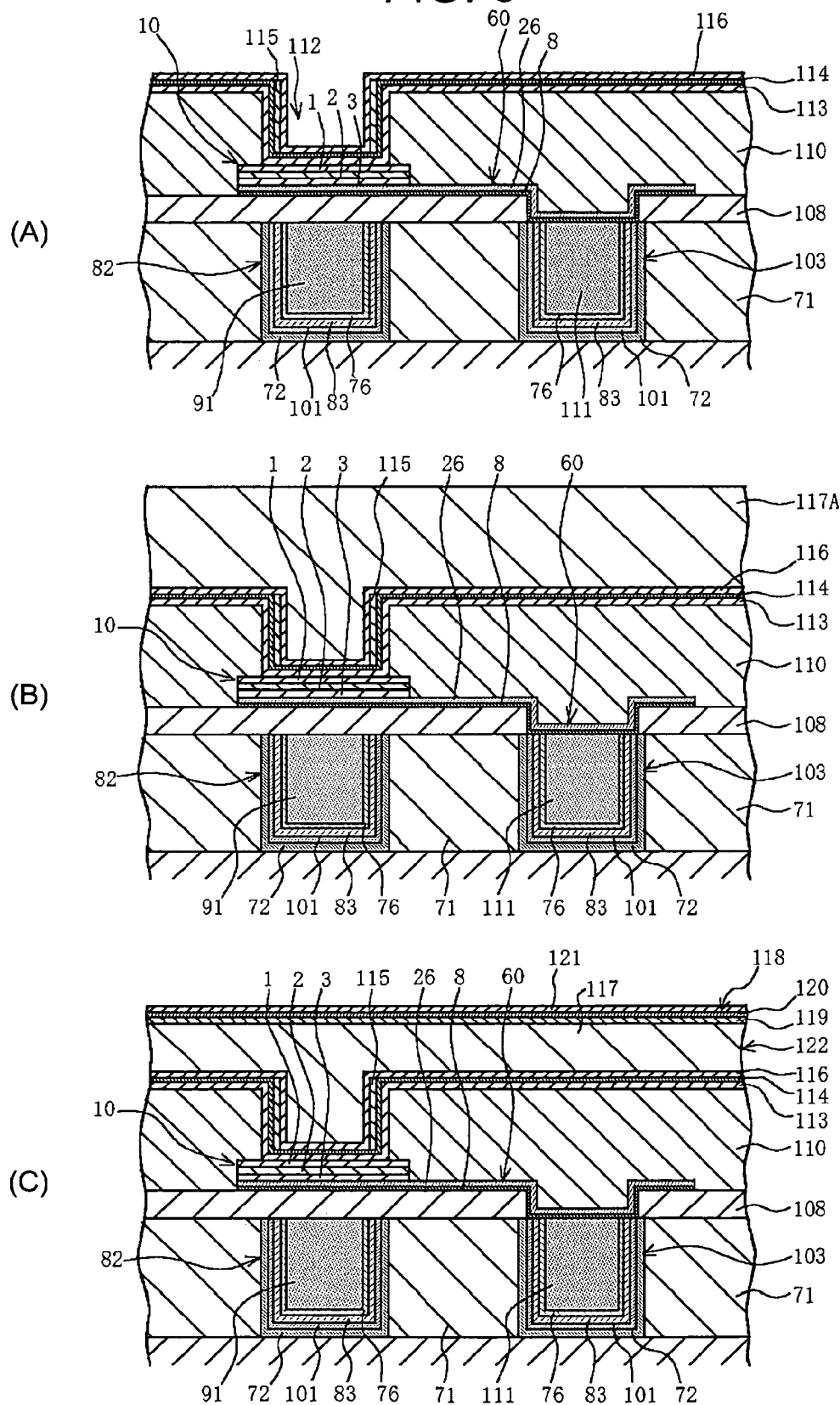
FIG. 5A to 5C show cross-sectional views illustrating the subsequent steps in the process for preparing the MRAM.

In the magnetic storage device according to a preferred embodiment of the present invention and the method of manufacturing the same, when the soft magnetic material layer and a diffusion barrier layer are formed in the trench at each outer periphery portion of the first wiring and the second wiring wherein the buried conductor (especially copper or a copper alloy) of the first wiring and/or the second wiring, the soft magnetic material layer, and the diffusion barrier layer are individually formed by electroless plating, the above-mentioned effect of the present invention is further improved.

It is desired that the first wiring and the second wiring are formed from copper or a copper alloy.

It is desired that the present invention is applied to a magnetic random access memory constituted so that a storage layer of the memory element is magnetized in a predetermined direction by means of a magnetic field induced by allowing a current to flow individually the first wiring and the second wiring to write information, and the written information is read by a tunnel magnetoresistance effect via the tunnel insulating layer.

Hereinbelow, preferred embodiments of the present invention will be described in detail with reference to the drawings.

First Preferred Embodiment of the Present Invention

FIGS. 1 to 11 show the first preferred embodiment of the present invention.

A method of manufacturing a magnetic storage device, particularly an MRAM according to the present preferred embodiment of the present invention will be described. First, as shown in FIG. 1A, in an insulating layer 71 on a substrate (not shown) having a transistor formed, a wiring trench 70 to be plugged with a word line and a read-out line (wherein a signal line and a sense line are not distinguished) positioned under a TMR (MRAM) element is formed. The wiring trench 70 is formed by processing the insulating layer 71 by lithography and dry etching.

Then, as shown in FIG. 1B, a first diffusion barrier layer 72 for the word line and read-out line is formed on the entire surface including the wiring trench 70 by a sputtering, CVD, or ALD method (this applies to the following). The first diffusion barrier layer 72 is deposited all over a bottom surface 73 and a sidewall 74 of the wiring trench 70 and a field portion 75, excluding the wiring portion (namely, the entire surface).

The first diffusion barrier layer 72 is formed from tantalum (Ta), tantalum nitride (TaN), titanium (Ti), titanium nitride (TiN), tungsten nitride (WN), zirconium nitride (ZrN), or the like.

Then, as shown in FIG. 1C, a seed layer 100, which is subjected to the below-described electroless plating, is deposited by sputtering or the like.

A constituent material for the seed layer 100 may be a material which can be substituted in the below-described catalytic displacement plating, and the material has properties such that, for example, a) the material is including an element having an ionization tendency larger than that of a typical element for use in catalyst, such as palladium (Pd), silver (Ag), gold (Au), or platinum (Pt), and b) the material is soluble in sulfuric acid, hydrochloric acid, or the like. Examples include copper (Cu), nickel (Ni), and cobalt (Co), and copper (Cu) is used as a representative example in the present preferred embodiment of the present invention.

With respect to the thickness of the film of copper (Cu) constituting the seed layer 100, when the thickness is too small, the layer cannot serve as a seed. On the other hand, when the thickness is too large, a chemical solution used in the below-described process of removing copper (Cu) may adversely affect the layers, or the below-mentioned reaction between the soft magnetic material layer and copper in the seed layer 100 may adversely affect the magnetic properties of the soft magnetic material layer.

Therefore, it is desired that the copper film as the seed layer 100 has a thickness as small as possible, which falls in a range such that the copper film can serve as a seed. The thickness of the copper film varies depending on the form and size of the buried wiring, but, for example, when the wiring had 0.20 µm width/0.5 µm height (thickness), it is desired that the thickness is in the range of from 15 to 30 nm.

FIGS. 1D and 1E illustrate a process for forming a soft magnetic material layer 83 by electroless plating. FIG. 1D illustrates a catalytic plating process, and FIG. 1E illustrates a deposition process for the soft magnetic material layer by electroless plating.

Figure 6:
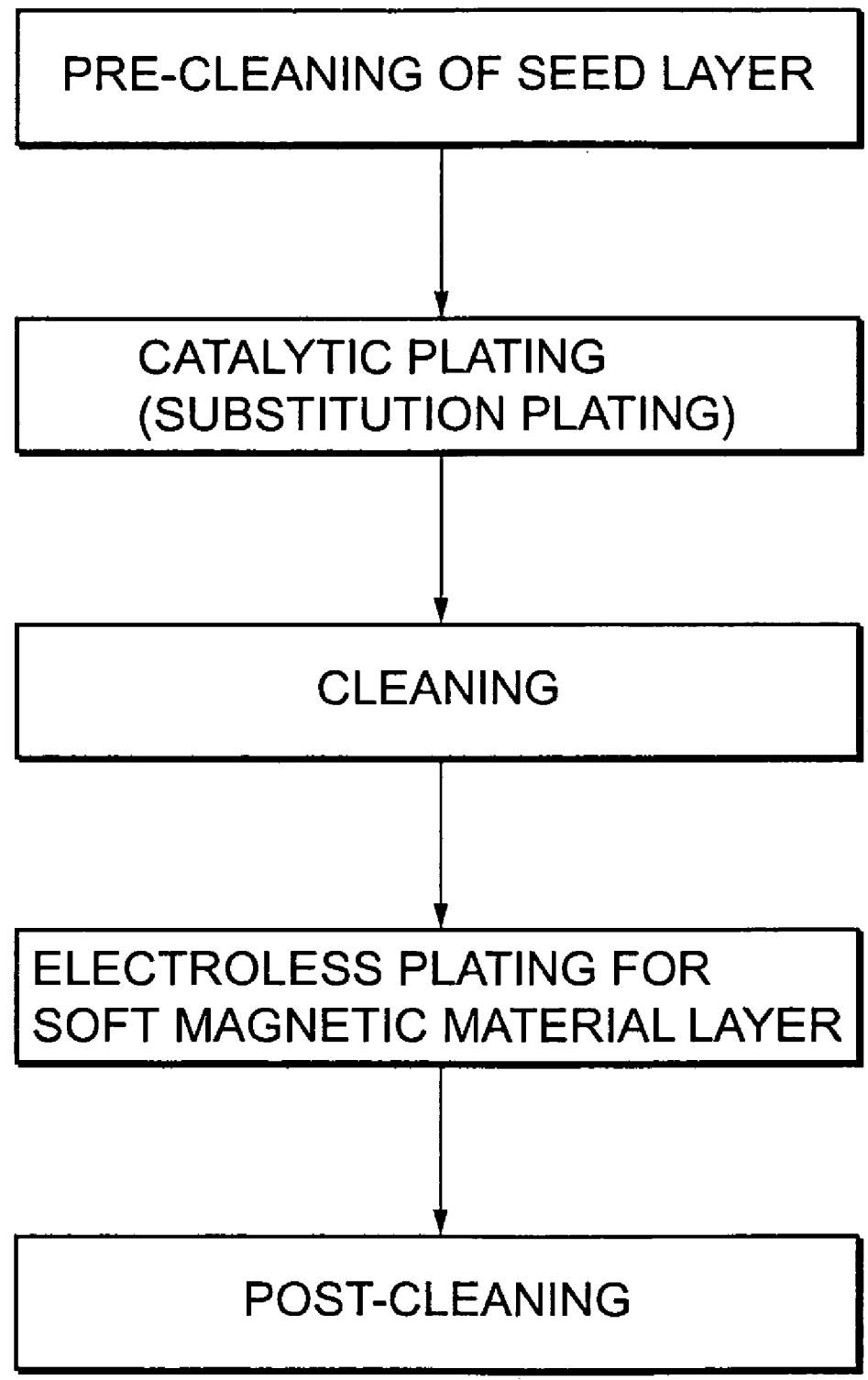
FIG. 6 shows a flowchart of a plating process in the first preferred embodiment of the present invention.

A detailed process flow of FIGS. 1D and 1E is shown in FIG. 6. First, as a pretreatment, a cleaning process for removing foreign particles and natural oxide adhering to the copper film as the seed layer 100 is performed. The copper film as the seed layer 100 deposited on the sidewall 74 of the wiring trench is very thin, and therefore there is a need to take enormous care in choosing the cleaning solution and the etching depth.

Figure 7:
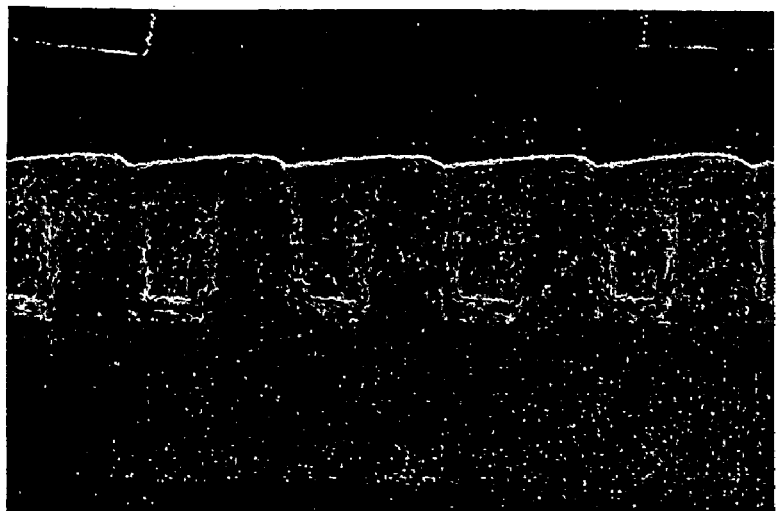
FIG. 7A to 7C show photomicrographs for explaining the dependency of electroless plating for a soft magnetic material layer on the pre-cleaning of a seed layer in the first preferred embodiment of the present invention.
Figure 7:
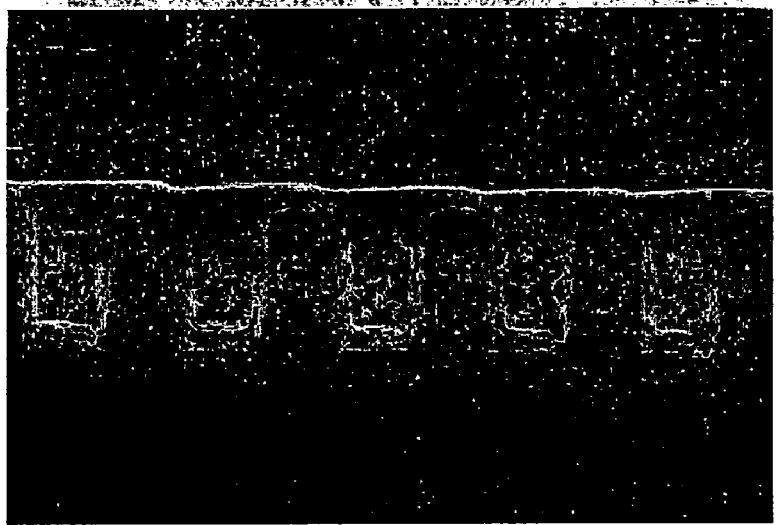
Figure 7:
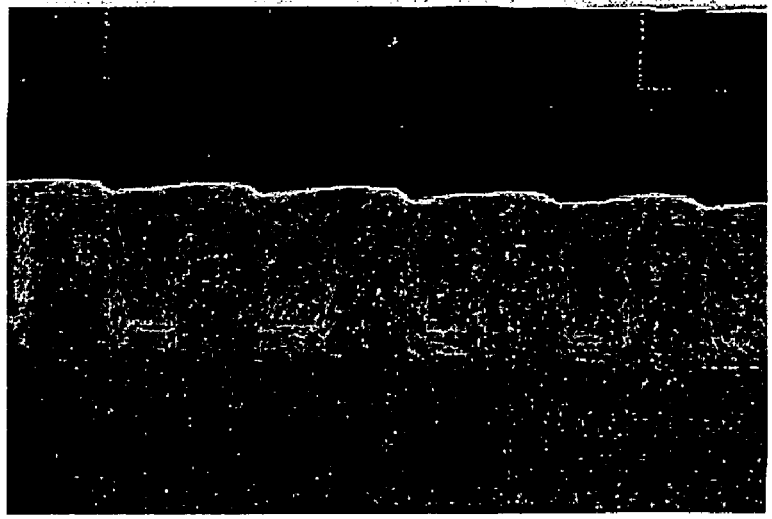

One example is shown FIG. 7, and, as seen in FIG. 7, the cleaned surface becomes uniform, and therefore it is found that a cleaning method using an alkaline chelating agent is effective. It is noted that this pre-cleaning is not always needed and, for example, when the below-described catalytic displacement plating (FIG. 1E) is conducted within several hours after forming the copper film as the seed layer 100, the pre-cleaning is not needed.

Then, as shown in FIG. 1D, a catalytic plating step is performed. As a catalyst 101 in this step, palladium (Pd), silver (Ag), gold (Au), platinum (Pt), or the like can be used. A displacement plating method using palladium (Pd) is shown as an example, and, when the seed layer 100 shown in FIG. 1C is subjected to catalytic displacement plating using palladium (Pd), palladium sulfate or palladium hydrochlorate is used.

Figure 8:
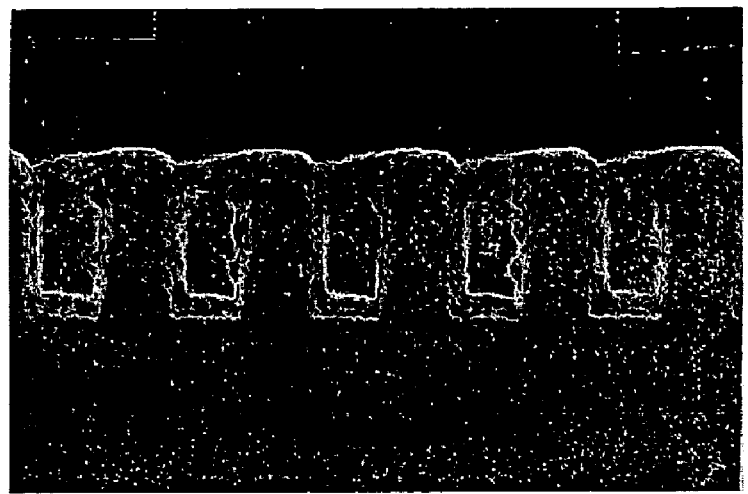
FIG. 8A to 8C show photomicrographs for explaining the dependency of electroless plating for a soft magnetic material layer on the palladium sulfate treatment time in the first preferred embodiment of the present invention.
Figure 8:
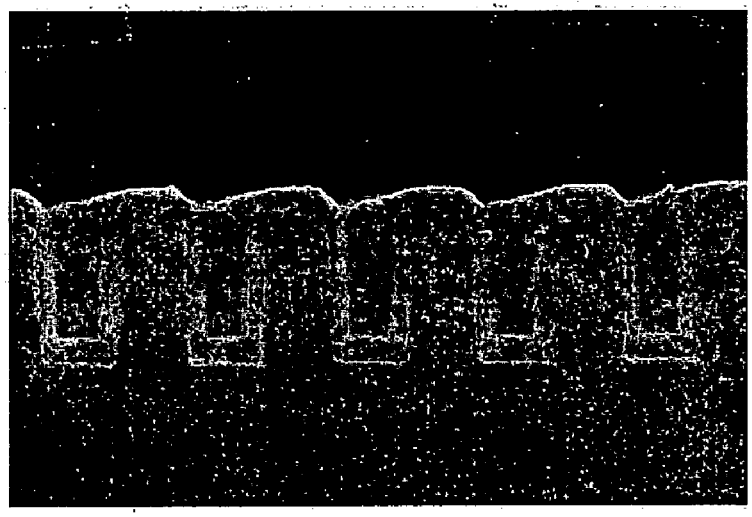
Figure 8:
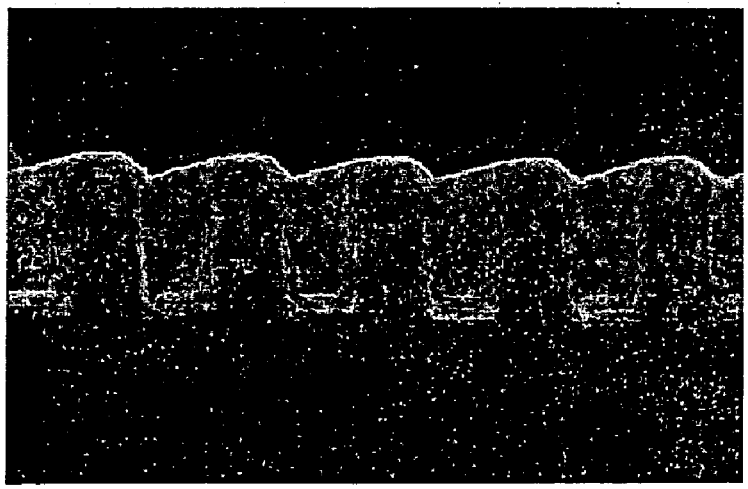
Figure 10:
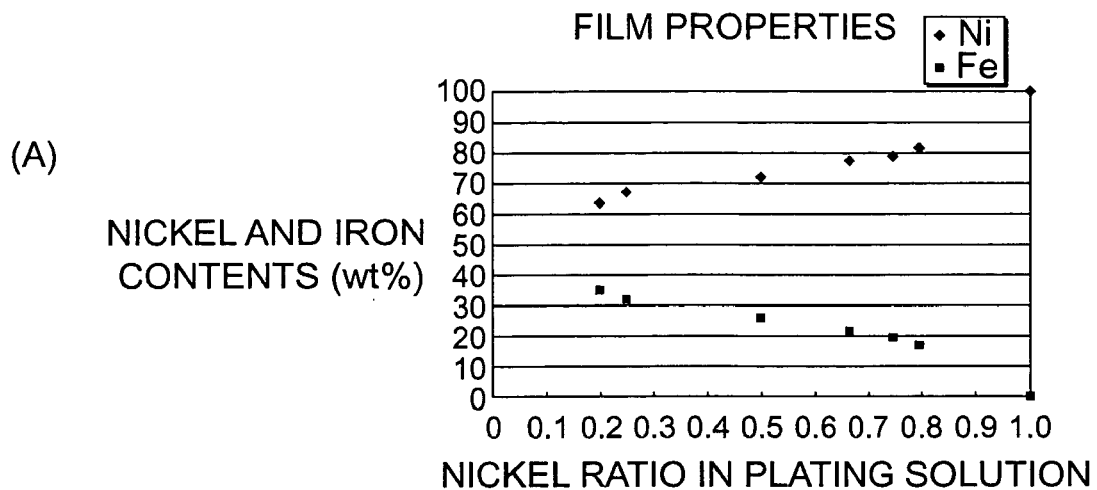
FIG. 10a to 10C show graphs and diagrams explaining the composition of a soft magnetic material layer and the cladding and film properties in the first preferred embodiment of the present invention.
Figure 10:
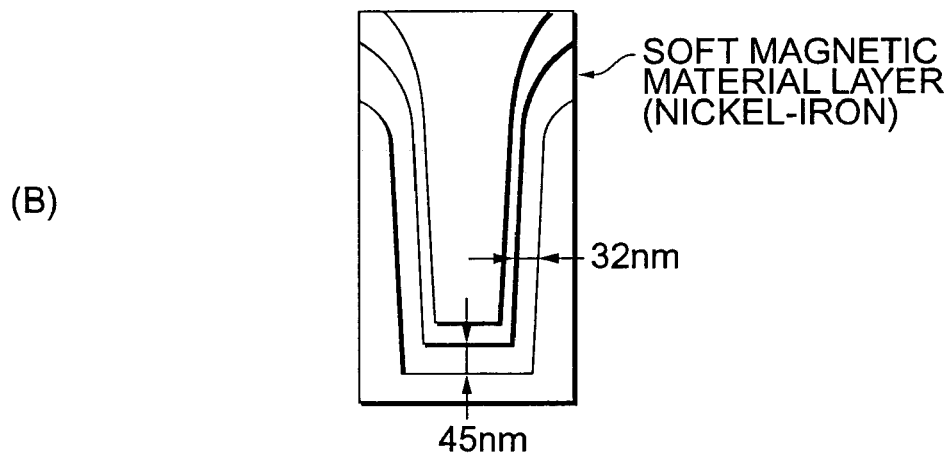
Figure 10:
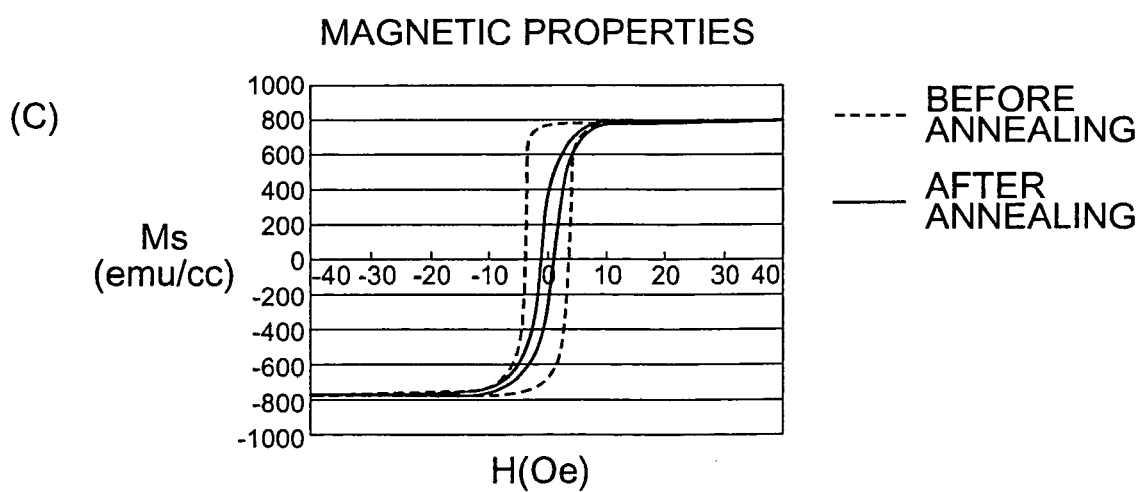

This process considerably affects the cladding for deposition by the below-described electroless plating. FIG. 8 shows the cladding of a nickel-iron-boron film deposited by electroless plating in terms of the palladium sulfate treatment time. From this, it is found that the cladding of the electroless plating layer is largely affected by the palladium sulfate treatment time and, for example, at a treatment time of 120 sec, an electroless plating layer is satisfactorily deposited, but, at a treatment time of 180 sec, the undercoat is dissolved and an electroless plating layer is not satisfactorily deposited. The palladium sulfate treatment time is advantageously in the range of from 90 to 180 sec.

After completion of the catalytic plating 101, cleaning is performed. Generally, when a chemical solution used in the catalyst is mixed into the below-described electroless plating solution, the electroless plating solution becomes unstable. Taking the above palladium sulfate as an example, when palladium (Pd) ions are mixed into the plating solution, a difference in ionization tendency causes palladium having a smaller ionization tendency to be deposited. The palladium deposited remains in the electroless plating solution and adversely affects the electroless plating as a source of particles.

This cleaning is accomplished without a particular problem merely by satisfactorily washing with pure water. As a further effective cleaning method, physical removal, typically ultrasonic cleaning, or the use of an organic acid, an organic acid containing a chelating agent, a surfactant (anionic or cationic), or a weak acid is effective, and the use of them in combination improves the cleaning effect.

Next, as shown in FIG. 1E, a soft magnetic material layer 83 is deposited by electroless plating. The soft magnetic material layer 83 is formed as a film containing an individual magnetic material, such as nickel (Ni), cobalt (Co), or iron (Fe), or an alloy thereof, and phosphorus (P), boron (B), or the like contained in a reducing agent in the electroless plating solution.

Representative examples include films containing an alloy included mainly of a magnetic material, such as nickel-iron Permalloy (Ni—Fe), cobalt-iron (Co—Fe), or cobalt-nickel-iron (Co—Ni—Fe), and phosphorus (P), boron (B) contained in a reducing agent therefor. In the tables of FIG. 9, conditions for the nickel-iron-boron deposition by electroless plating are shown as one typical example, and conditions for the palladium sulfate displacement plating are shown as one typical example of conditions for the above catalytic plating.

In FIG. 10A to 10C, examples of properties (composition change, cladding, magnetic properties) of the nickel-iron-boron film 83 deposited by electroless plating are shown. From those graphs, it is observed that the soft magnetic material layer is deposited with improved cladding and its magnetic properties are satisfactory after annealing.

After the soft magnetic material layer 83 is formed by electroless plating, the plating solution is washed away by satisfactorily washing with pure water. Finally, main cleaning is performed. The main cleaning process may be performed if necessary. In the main cleaning process, it is desired that an alkaline chemical agent is used, and, when a chelating agent, a surfactant, or the like is added, a higher effect can be obtained, and the use of the alkaline chemical agent and ultrasonic cleaning in combination is effective. Cleaning using a dilute acid is effective, but, when the soft magnetic material layer is including a cobalt material, the layer is dissolved in an acid, and hence satisfactory care is needed.

Above described is the deposition process for the soft magnetic material layer 83 by electroless plating.

Next, as shown in FIG. 2A, a second diffusion barrier layer 76 is deposited on the entire surface, and then, as shown in FIG. 2B, a seed layer 77 is deposited on the entire surface.

The second diffusion barrier layer 76 is formed from the same material as that for the first diffusion barrier layer 72 shown in FIG. 1B. Copper (Cu) is used in the below-described plugging the wiring trench 70 with wiring, and therefore it is desired that copper (Cu) is used in the seed layer 77. In deposition of these layers, the same method as that shown in FIGS. 1B and 1C is used, and a sputtering method is generally used.

The thickness of the second diffusion barrier layer 76 is one of the factors that considerably affect the below-described step for removing excess metal. Specifically, formation of the second diffusion barrier layer 76 having a thickness as small as possible is advantageous in the below-described removing step.

Figure 11:
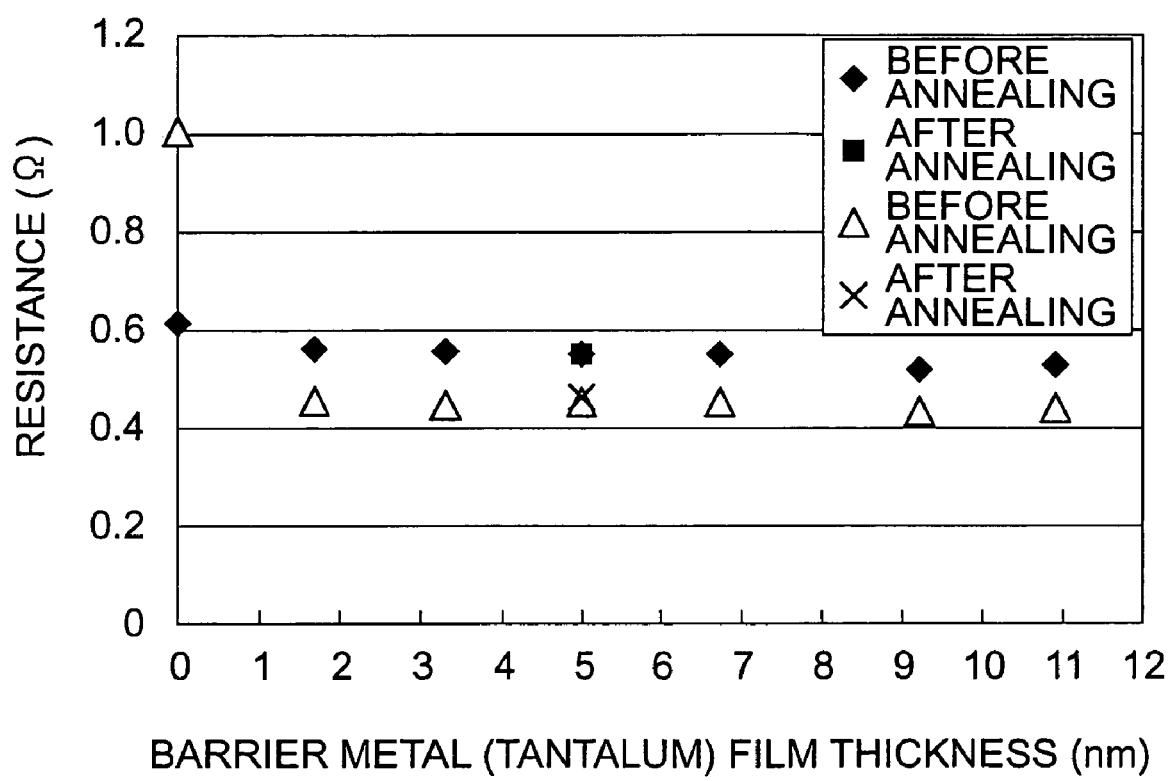
FIG. 11 shows a graph for explaining the properties of a diffusion barrier layer in the first preferred embodiment of the present invention.

FIG. 11 shows an example of evaluation of the barrier properties of a barrier metal (tantalum) used in the diffusion barrier layer 76 (and 72). From the results, it is found that, when a tantalum film having a thickness of 1.7 nm or more is inserted as a barrier metal layer, an annealing treatment for, for example, copper layers 91, 111 buried by the below-described electro-plating considerably lowers the resistance of the buried wiring, as compared to the treatment performed when a tantalum film has a thickness of less than 1.7 nm, which indicates that the tantalum film having the above thickness functions as a barrier metal. For obtaining a function as a barrier metal, the barrier metal may be deposited on the sidewall and bottom of the wiring trench, but the most indispensable portion is the sidewall of the wiring trench. Although varying depending on the deposition method for the barrier metal layer and the form of wiring, when a tantalum layer having a thickness of 1.7 nm or more is deposited on the sidewall of the wiring trench, barrier properties can be secured. When the below-described step for removing excess metal has satisfactory removal performance, the second diffusion barrier layer 76 may have a large thickness.

Next, as shown in FIG. 2C, using the copper film of the seed layer 77 shown in FIG. 2B as a growth nucleus and an electrode, a copper (Cu) layer 81A is deposited by an electroplating method on the entire surface including the wiring trench 70. An electro-plating method is used in the present preferred embodiment of the present invention, but an electroless plating method, a CVD method, or the like may be used.

Then, as shown in FIG. 2D, excess copper (Cu) of the copper (Cu) layer 81A deposited on the portion excluding the wiring portion is removed, and then, the excess wiring material 81A (including the seed layer 77), second diffusion barrier layer 76, soft magnetic material layer 83, seed layer 100 (not shown), catalyst 101, and first diffusion barrier layer 72 on the insulating layer 71 are successively removed by a chemical mechanical polishing (CMP) method so that the wiring materials remain in the wiring trench 70. Thus, the wiring trench 70 is plugged with a word line 82 and a read-out line 103 so that the wiring materials 91, 111, the second diffusion barrier layer 76, the soft magnetic material layer 83, the catalyst 101, and the first diffusion barrier layer 72, and the like (the seed layers are not shown) remain in the wiring trench 70, while planarizing the surface.

Then, as shown in FIG. 3A, for preventing the wiring copper 91, 111 from diffusing, an insulating film 108 including silicon nitride (SiN), silicon carbide (SiC) or the like for preventing copper diffusion is deposited. On the insulating film, a silicon oxide film ($SiO_2$) (not shown) may be deposited to constitute an interlayer dielectric film together with the insulating film 108, but deposition of the silicon oxide film is not always needed, and the interlayer dielectric film may be formed only from the insulating film 108 for preventing diffusion.

Then, as shown in FIG. 3B, a contact hole 109 for connecting a TMR element and a read-out line 83 is formed in the insulating film 108 by lithography and dry etching, and then, on the entire surface including the contact hole 109, layers of constituent materials for the TMR element are successively deposited by a sputtering method or the like. For example, Ta (undercoat layer) 8, a stacked film 26 including PtMn (antiferromagnetic material layer), CoFe (second magnetized pinned layer), Ru (antiferromagnetic binding layer), and CoFe (first magnetized pinned layer), a tunnel barrier layer 3 including $Al_2O_3$, CoFe-30B (storage layer) 2, and Ta (topcoat layer) 1 are successively deposited.

Then, as shown in FIG. 3C, a portion constituting a TMR element 10 is formed by lithography and dry etching, and then a wiring 60 for connecting the TMR element 10 and the read-out line 103 is formed by lithography and dry etching. The wiring 60 may be including the stacked film 26 and the undercoat layer 8, but the material for film on the undercoat layer 8 can be arbitrarily changed.

Then, as shown in FIG. 3D, an insulating layer 110 is formed on the entire surface, and then a contact hole 112 is formed in the insulating layer 110 by lithography and dry etching.

Then, as shown in FIG. 4A, a first diffusion barrier layer 113 for bit line is formed on the entire surface including the contact hole 112 and a wiring trench (not shown), and then, on the first diffusion barrier layer, a seed layer is formed and then first subjected to catalytic displacement plating 114 in the same manner as mentioned in connection with FIGS. 1C and 1D and FIG. 6.

As a constituent material for the first diffusion barrier layer 113, tantalum (Ta), tantalum nitride (TaN), titanium (Ti), titanium nitride (TiN), tungsten nitride (WN), zirconium nitride (ZrN), etc. can be used. In deposition of this layer, a sputtering method is widely used, and other examples include a CVD method and an ALD method, and the method for the deposition is selected depending on the form and size of the contact hole in which the barrier metal layer is formed.

A constituent material for the seed layer may be a material which can be substituted in catalytic displacement plating, and the material has properties such that, for example, a) the material is including an element having an ionization tendency larger than that of a typical element for use in catalyst, such as palladium (Pd), silver (Ag), gold (Au), or platinum (Pt), and b) the material is soluble in sulfuric acid, hydrochloric acid, or the like. Examples include copper (Cu), nickel (Ni), and cobalt (Co), and copper (Cu) is used as a representative example in the present preferred embodiment of the present invention.

As the catalyst 114 used in the catalytic displacement plating, palladium (Pd), silver (Ag), gold (Au), platinum (Pt), or the like can be used. A displacement plating method using palladium (Pd) is shown as an example, and, when the seed layer is subjected to catalytic displacement plating using palladium (Pd), palladium sulfate or palladium hydrochlorate is used.

Next, as shown in FIG. 4B, a soft magnetic material layer 115 is deposited by electroless plating. The soft magnetic material layer 115 is formed as a film containing an individual magnetic material, such as nickel (Ni), cobalt (Co), or iron (Fe), or an alloy thereof, and phosphorus (P), boron (B), or the like contained in a reducing agent in the electroless plating solution.

Representative examples include films containing an alloy included mainly of a magnetic material, such as nickel-iron Permalloy (Ni—Fe), cobalt-iron (Co—Fe), or cobalt-nickel-iron (Co—Ni—Fe), and phosphorus (P), boron (B) contained in a reducing agent therefor.

Then, as shown in FIG. 4C, the soft magnetic material layer 115 on the bottom of each of the contact hole 112 and a wiring trench 130 indicated by a virtual line is selectively removed so that the soft magnetic material layer 115 remains only on the sidewall of the contact hole 112 and the insulating layer 110. The selective removal of the soft magnetic material layer can be made by various methods, e.g., dry etching, ion milling, or etchback.

Then, as shown in FIG. 5A, a second diffusion barrier layer 116 is deposited on the entire surface, and then a seed layer (not shown) is formed in the same manner as shown in FIG. 2B.

The second diffusion barrier layer 116 is formed from the same material as that for the first diffusion barrier layer 113 shown in FIG. 4A. Copper (Cu) is used in the below-described plugging the wiring trench with wiring, and therefore it is desired that copper (Cu) is used in the seed layer.

In deposition of these layers, the same method as that shown in FIGS. 2A and 2B is used, and a sputtering method is generally used.

Next, as shown in FIG. 5B, using the copper film of the above seed layer as a growth nucleus and an electrode, copper (Cu) 117A is deposited by an electro-plating method on the entire surface including the contact hole 112 and wiring trench 130. An electro-plating method is used in the present preferred embodiment of the present invention, but an electroless plating method, a CVD method, or the like may be used.

Then, as shown in FIG. 5C, excess copper (Cu) of the copper (Cu) layer 117A deposited on the portion excluding the wiring portion is removed in the same manner as shown in FIG. 2D, and then, the excess wiring material 117A {including the seed layer (not shown)}, second diffusion barrier layer 116, soft magnetic material layer 115, seed layer (not shown), catalyst 114, and first diffusion barrier layer 113 on the insulating layer 110 are successively removed by a chemical mechanical polishing (CMP) method so that the wiring materials remain in the wiring trench 130. Thus, the contact hole 112 and the wiring trench 130 are plugged with a main wiring 118 for bit line so that the wiring material 117, the second diffusion barrier layer 116, the soft magnetic material layer 115, the catalyst 114, and the first diffusion barrier layer 113, and the like (the seed layers are not shown) remain in the wiring trench, while planarizing the surface.

Figure 22A:
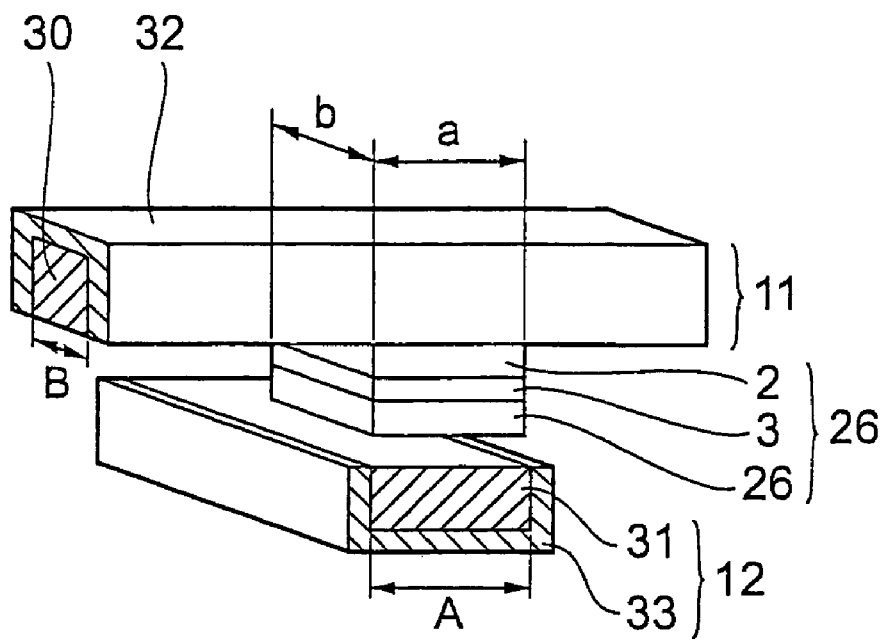
FIGS. 22A and 22B show a cross-sectional perspective view A of an essential portion of a conventional MRAM, and cross-sectional view B illustrating the state of an induced magnetic field generated around a wiring.
Figure 22B:
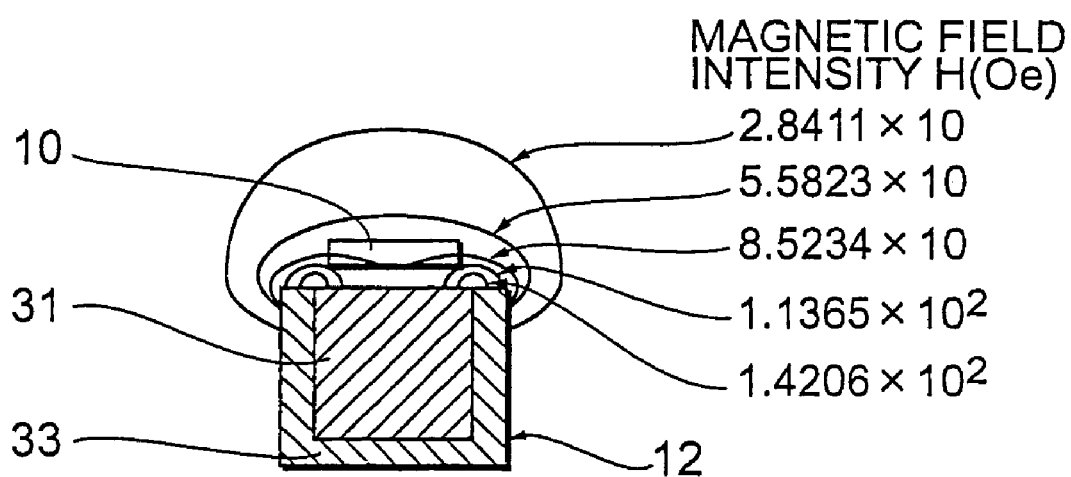
Figure 23:
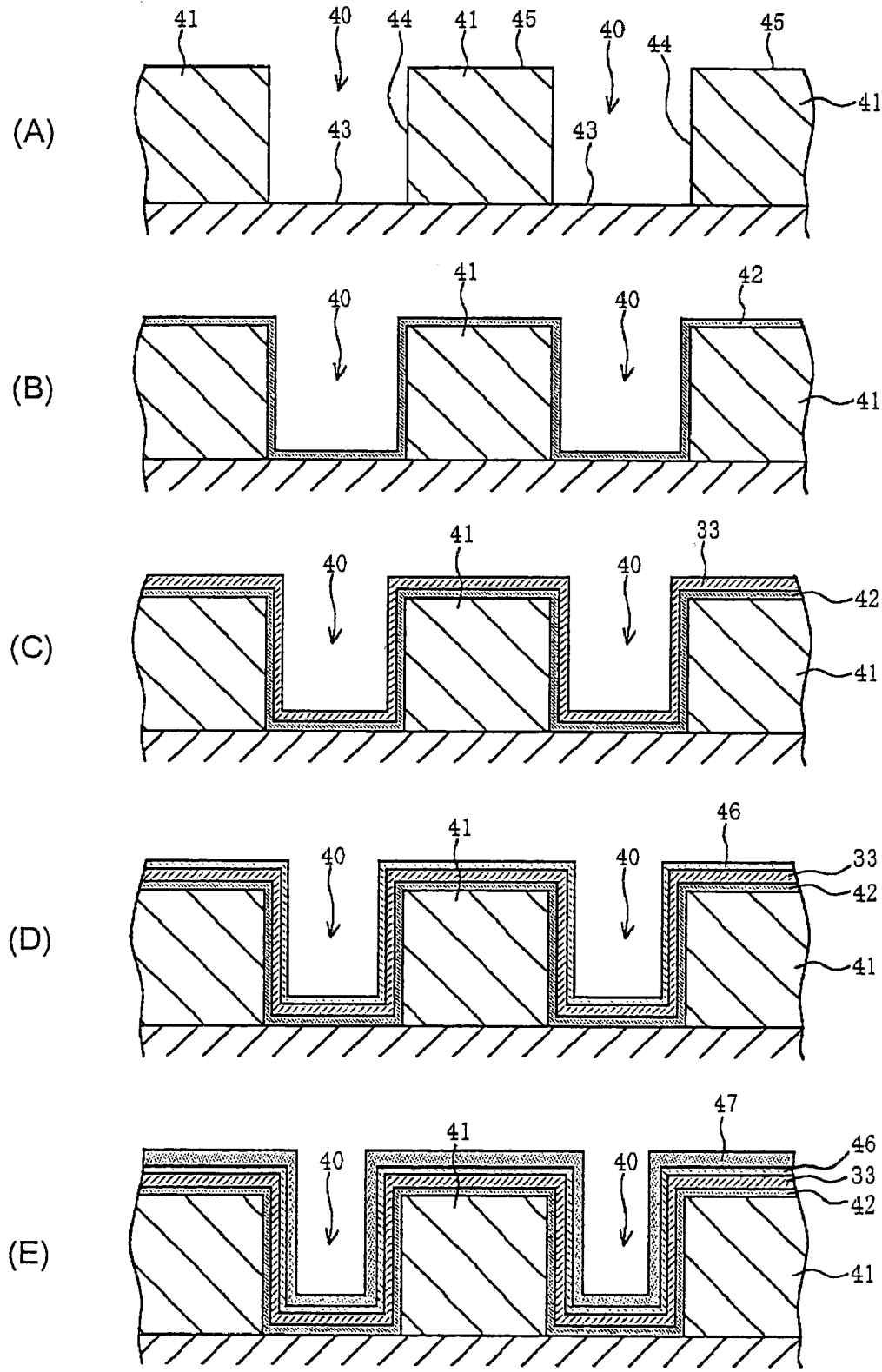
FIG. 23A to 23E show cross-sectional views illustrating successive steps in a process for preparing the conventional MRAM.
Figure 24:
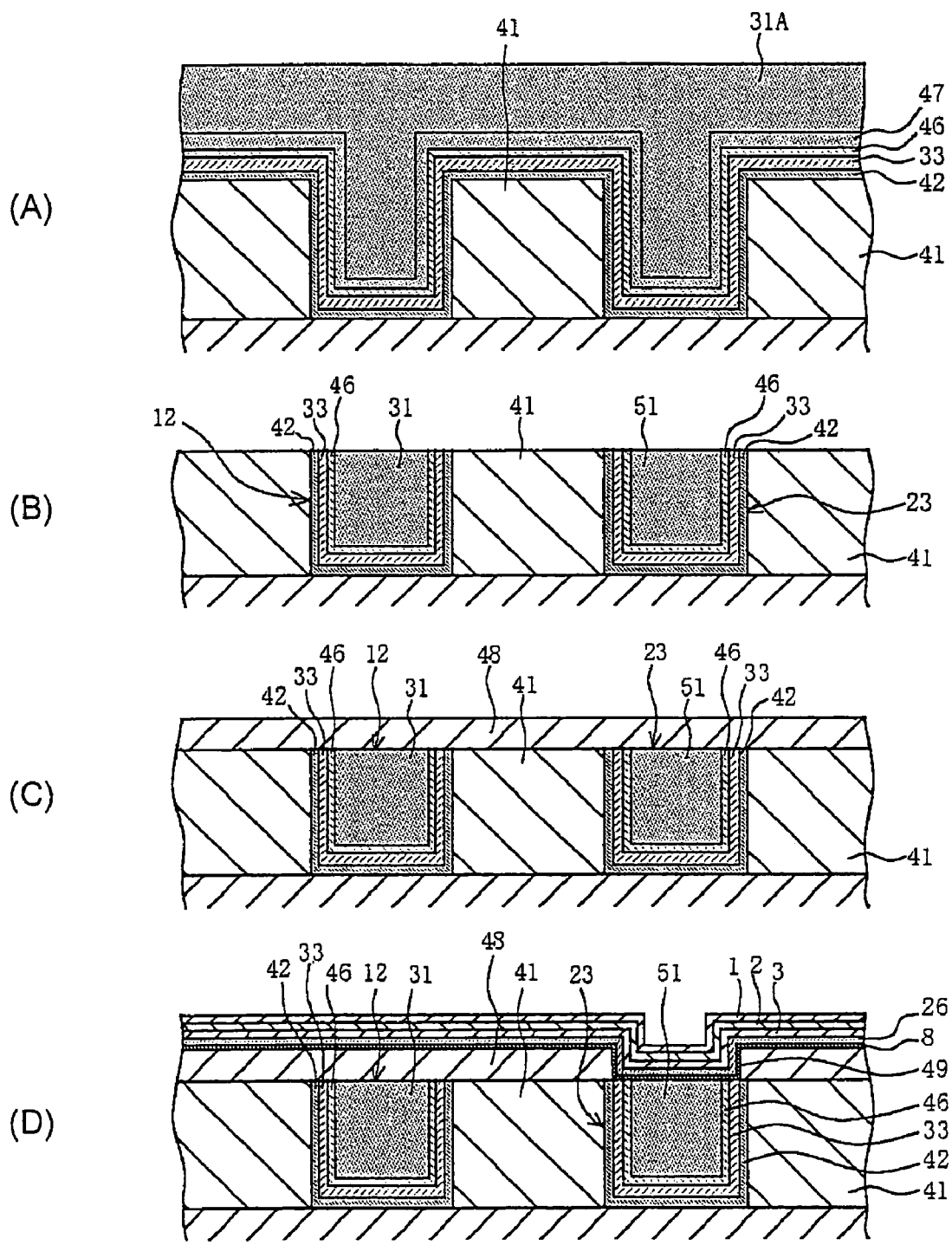
FIG. 24A to 24D show cross-sectional views illustrating the subsequent steps in the process for preparing the MRAM.
Figure 25:
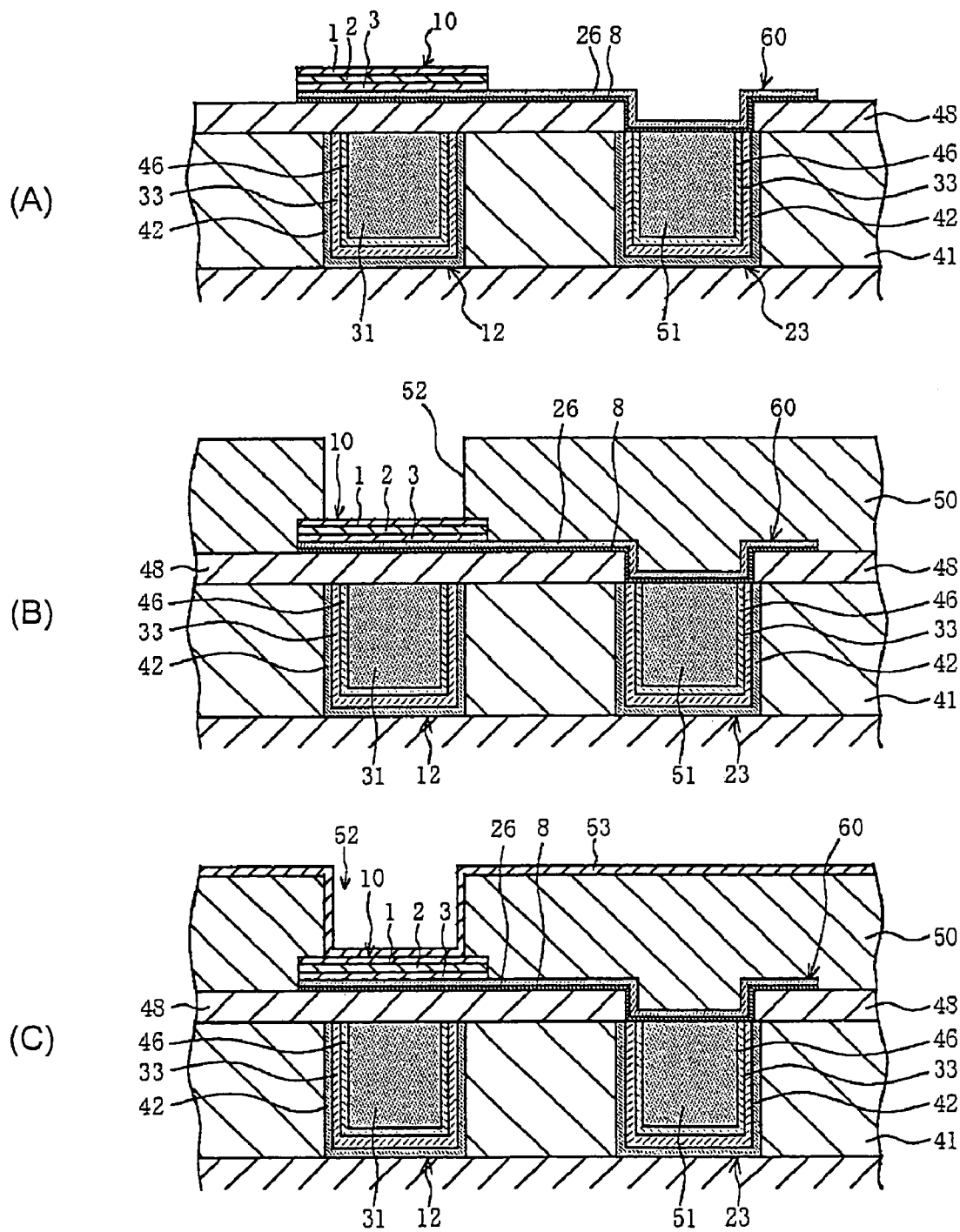
FIG. 25A to 25C show cross-sectional views illustrating the subsequent steps in the process for preparing the MRAM.
Figure 26:
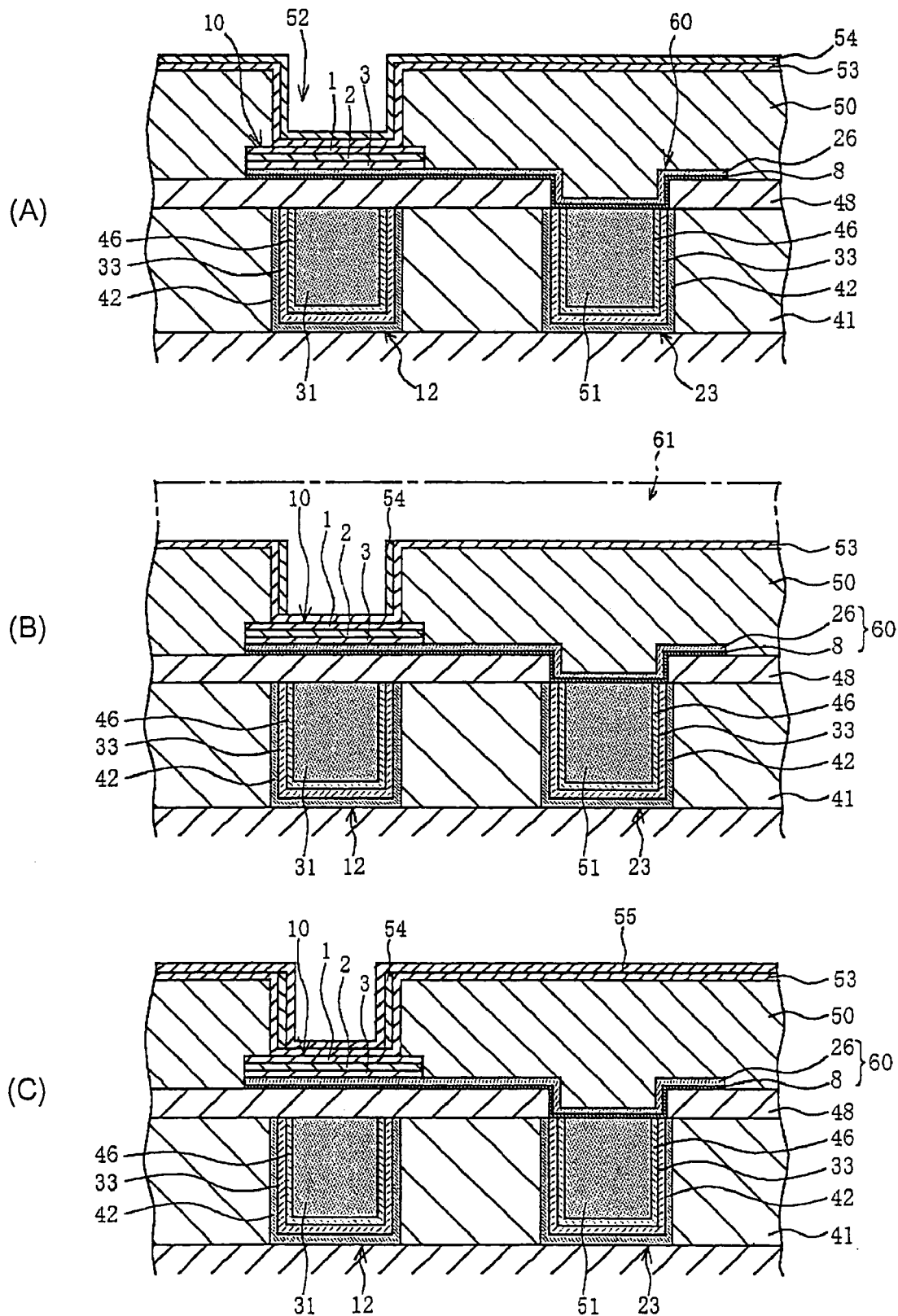
FIG. 26A to 26C show cross-sectional views illustrating the subsequent steps in the process for preparing the MRAM.
Figure 27:
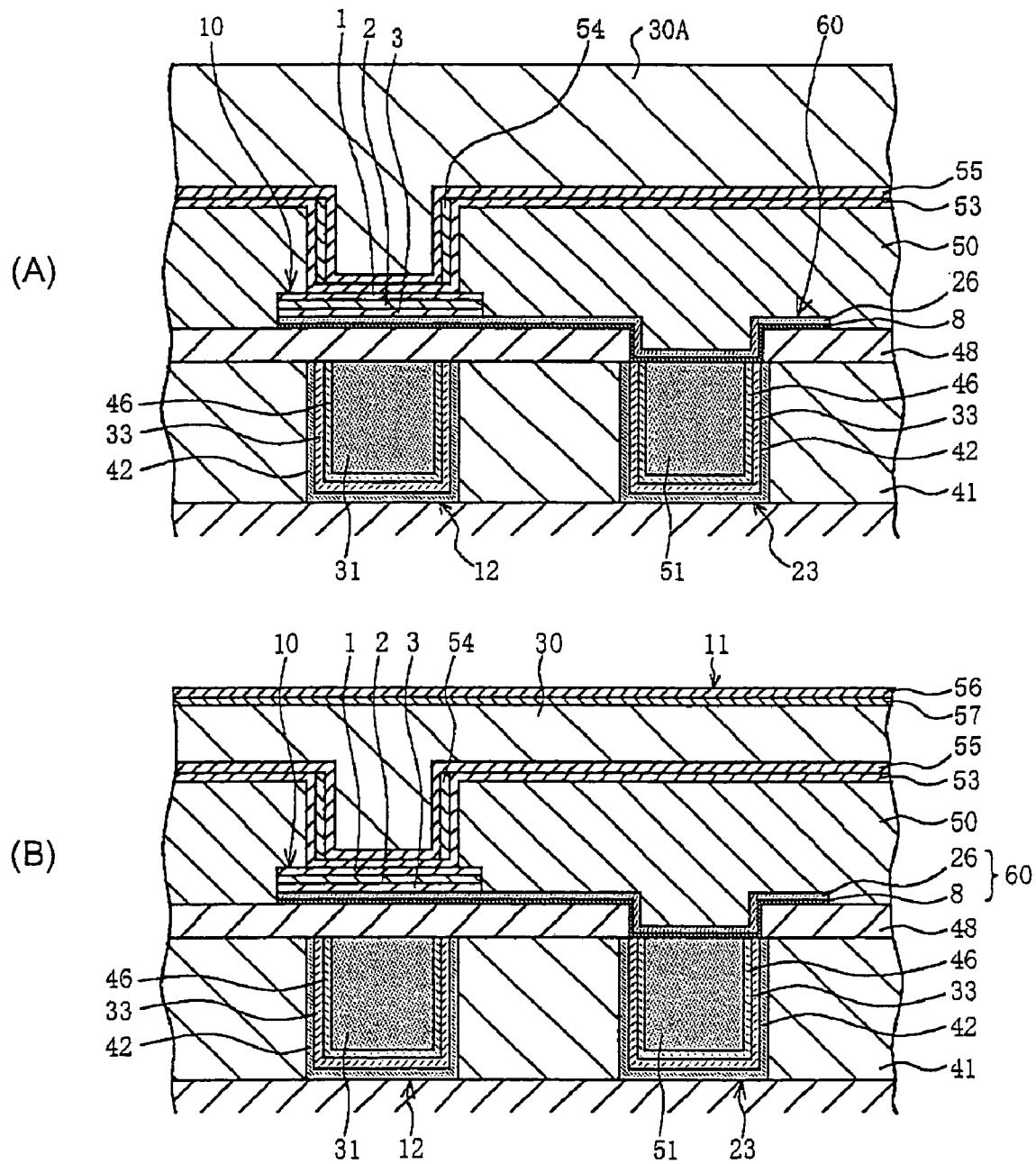
FIG. 27A to 27B show cross-sectional views illustrating the subsequent steps in the process for preparing the MRAM.

Then, a diffusion barrier layer 119 and a catalytic plating 120 are formed on the copper layer 117 in the same manner as shown in FIGS. 4A and 4B, and then a soft magnetic material layer 121 is deposited with a predetermined pattern by electroless plating so that it is connected to the soft magnetic material layer 115 on the sidewall of the wiring trench, forming a bit line 122 having a structure shown in FIG. 22A. The soft magnetic material layer 121 may be patterned by lithography and etching after the electroless plating. The soft magnetic material layer 121 is formed as a film containing an individual magnetic material, such as nickel (Ni), cobalt (Co), or iron (Fe), or an alloy thereof, and phosphorus (P), boron (B), or the like contained in a reducing agent in the electroless plating solution.

Representative examples include films containing an alloy constituted mainly of a magnetic material, such as nickel-iron Permalloy (Ni—Fe), cobalt-iron (Co—Fe), or cobalt-nickel-iron (Co—Ni—Fe), and phosphorus (P), boron (B) contained in a reducing agent thereof.

Formation of the soft magnetic material layer 121 by the above-described electroless plating is advantageous since the same plating solution as that used in the electroless plating for the soft magnetic material layer 115 can be used, but the soft magnetic material layer is formed on the surface of the bit line, and hence may be formed by another method other than electroless plating such as sputtering.

As described above, an MRAM (TMR) element having the word line 82, read-out line 103, and bit line 122, in which a copper layer, a soft magnetic material layer, diffusion preventing layers, and the like are buried, can be prepared by a damascene method.

In the present preferred embodiment of the present invention, as described above, the soft magnetic material layers 83, 115, 121 constituting the cladding structure of the word line 82 and bit line 122 are formed by electroless plating, and therefore the soft magnetic material layers 83, 115, 121 can be formed around the main wirings 91, 117 (especially copper) of the word line 82 and bit line 122 so that the soft magnetic material layers individually have a uniform, satisfactory thickness. Thus, an induced magnetic field generated at the word line 82 and bit line 122 can be efficiently introduced to the memory element 10, and hence the current fed to the wiring required for generating the magnetic field can be reduced, so that not only can the power consumption of the magnetic storage device be lowered, but also the storage sensitivity can be improved. Therefore, there is no need to reduce the distance between each wiring and the memory element 10 for improving the write efficiency of the word line 82 and bit line 122, making it possible to expand the process margin in formation of the insulating layer 108 or 110 therebetween.

In this case, a material having magnetic properties, such as nickel or an alloy thereof, or cobalt or an alloy thereof, can be easily deposited by electroless plating, and, when depositing an alloy film or the like, the composition of the film can be easily changed by controlling the plating solution or plating conditions, thus making it possible to easily obtain the required soft magnetic material properties.

The soft magnetic material layers 83, 115 are formed by electroless plating, and therefore they can be deposited with improved uniformity on the surface with which the electroless plating solution is in contact, and the uniformity of cladding is improved at not only the bottom surface but also the sidewall of a wiring trench, so that the soft magnetic material layer formed has a required minimum volume or thickness, making it possible to render the volume of the main wiring material (especially copper) relatively large. Therefore, the resistance of the wiring is reduced and the effective current density is further lowered, thus improving the wiring reliability such as electromigration resistance.

Deposition by electroless plating results in conformal cladding (which means that a film can be deposited uniformly along the underlying surface), and hence the soft magnetic material layers 83, 115, 121 each having a high resistance to chemical mechanical polishing (CMP) (hard to polish) and having a small thickness can be formed. Therefore, the time required for removing the unnecessary soft magnetic material layer by polishing can be shortened. Shortening the polishing time improves the throughput and suppresses dishing or erosion of the wiring, advantageously improving the yield of the wiring (wiring resistance, wiring short-circuiting) and the wiring reliability (suppression of reduction of the thickness of the wiring).

Figure 28:
FIG. 28 shows photomicrograph showing the cladding of a sputtered film in the conventional MRAM.

Further, overhang caused in the deposition by sputtering as shown in FIG. 28 does not occur, and therefore, in the process for plugging a trench with copper or the like as a wiring material, plugging failure, such as voids or seams, is not caused in the wiring, and hence a stable process can be established. In addition, the form of copper or the like as main wiring of the wiring formed is similar to the form of the wiring trench (which does not have a trapezoidal cross-section such that the upper portion of the wiring corresponds to the upper bottom), which form is such that the local stress caused by a thermal stress during the process is reduced, thus improving the resistance to stress migration.

The sputtering machine requires ultra-high vacuum and a large-scale power source, and hence has disadvantages in that the machine cost is high and machine trouble cause long downtime. By contrast, the electroless plating machine requires neither a power source nor a vacuum apparatus, and therefore is advantageous in the cost or TAT (turn-around-time). In addition, the sputtering machine generally carries out treatment under a sheet-form method, whereas the electroless plating machine can realize a treatment in batch mode such that a plurality of sheets can be simultaneously treated.

Second Preferred Embodiment of the Present Invention

Figure 12:
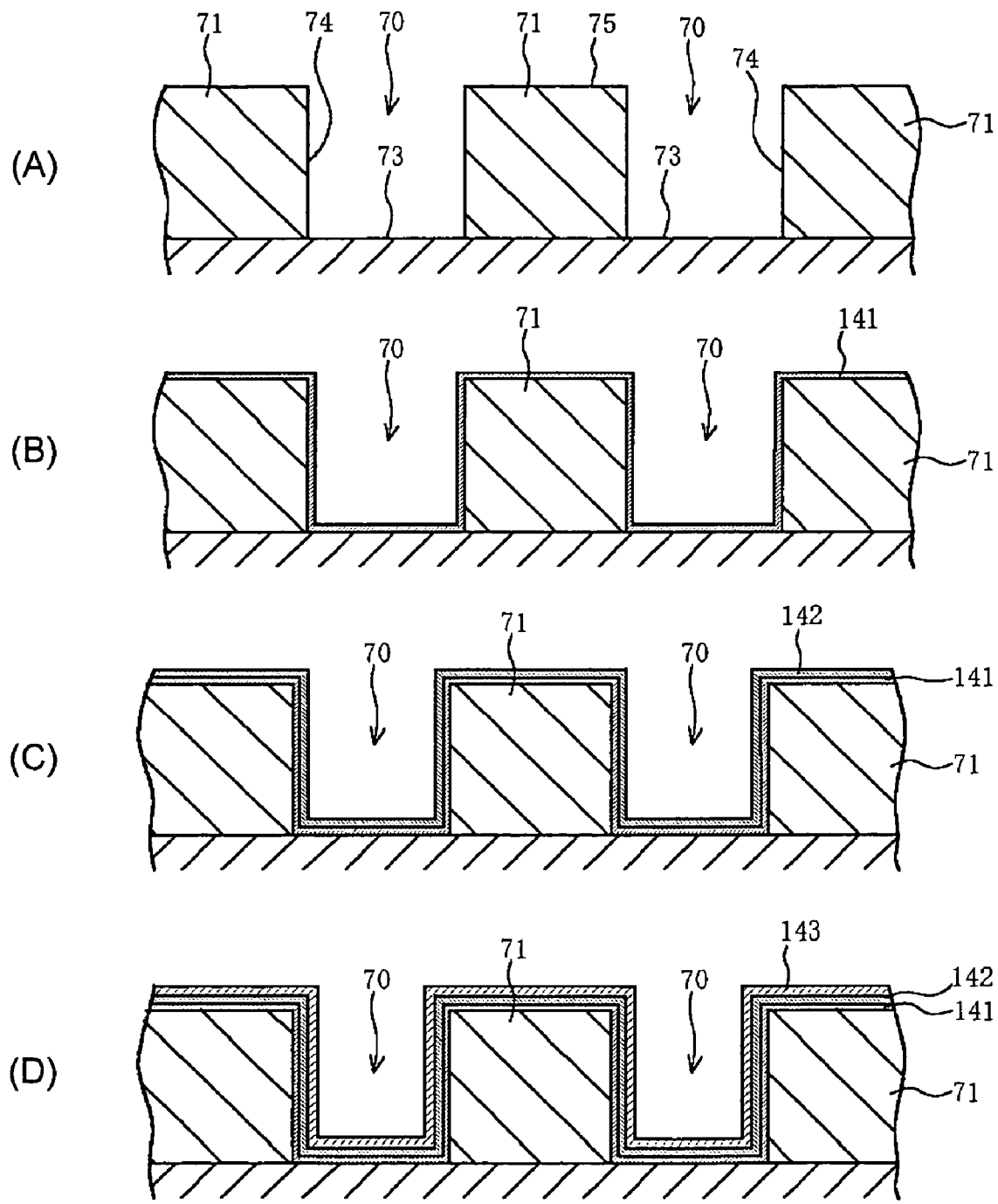
FIG. 12A to 12D show cross-sectional views illustrating successive steps in a process for preparing an MRAM according to a second preferred embodiment of the present invention.
Figure 13:
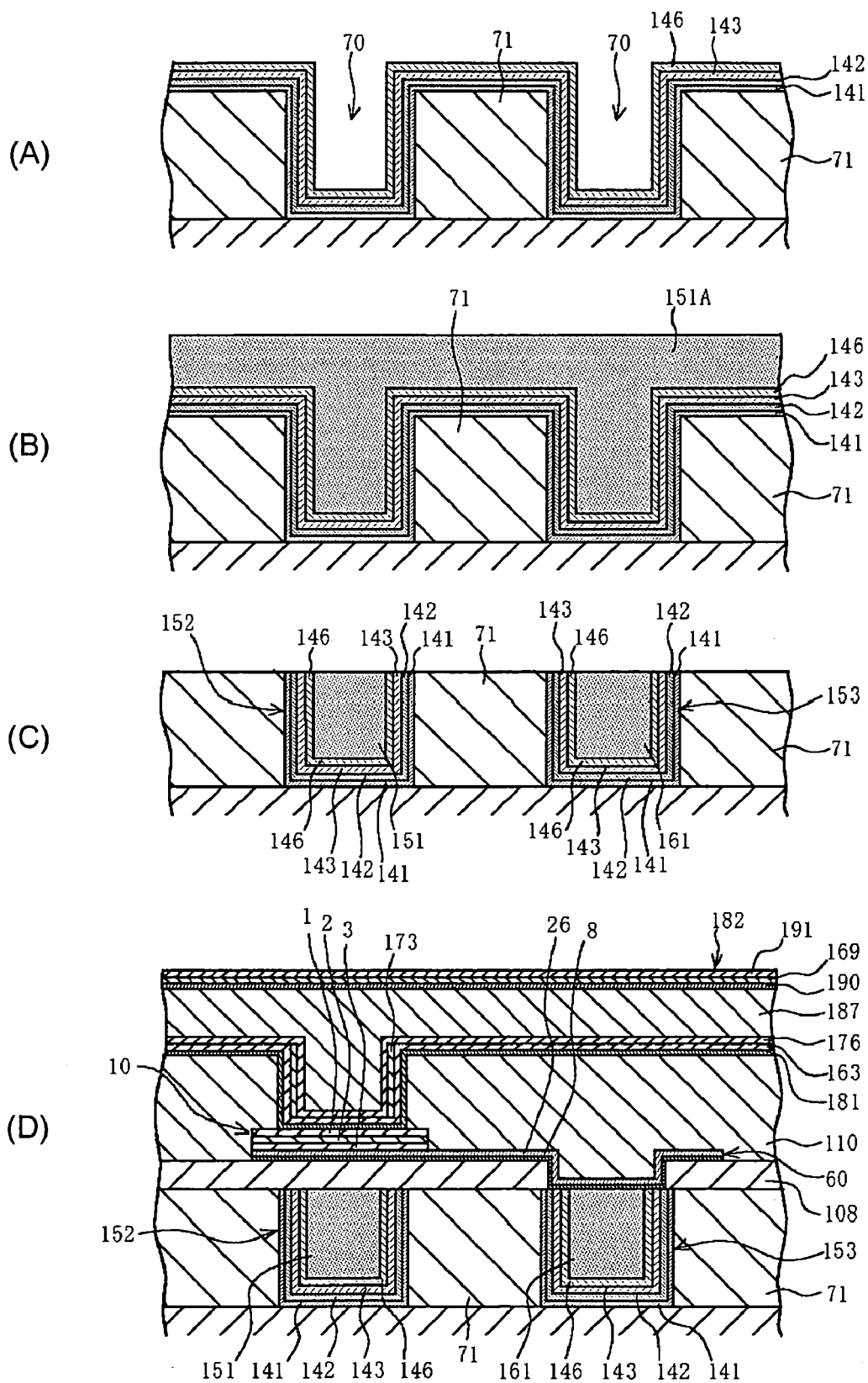
FIG. 13A to 13D show cross-sectional views illustrating the subsequent steps in the process for preparing the MRAM.
Figure 14:
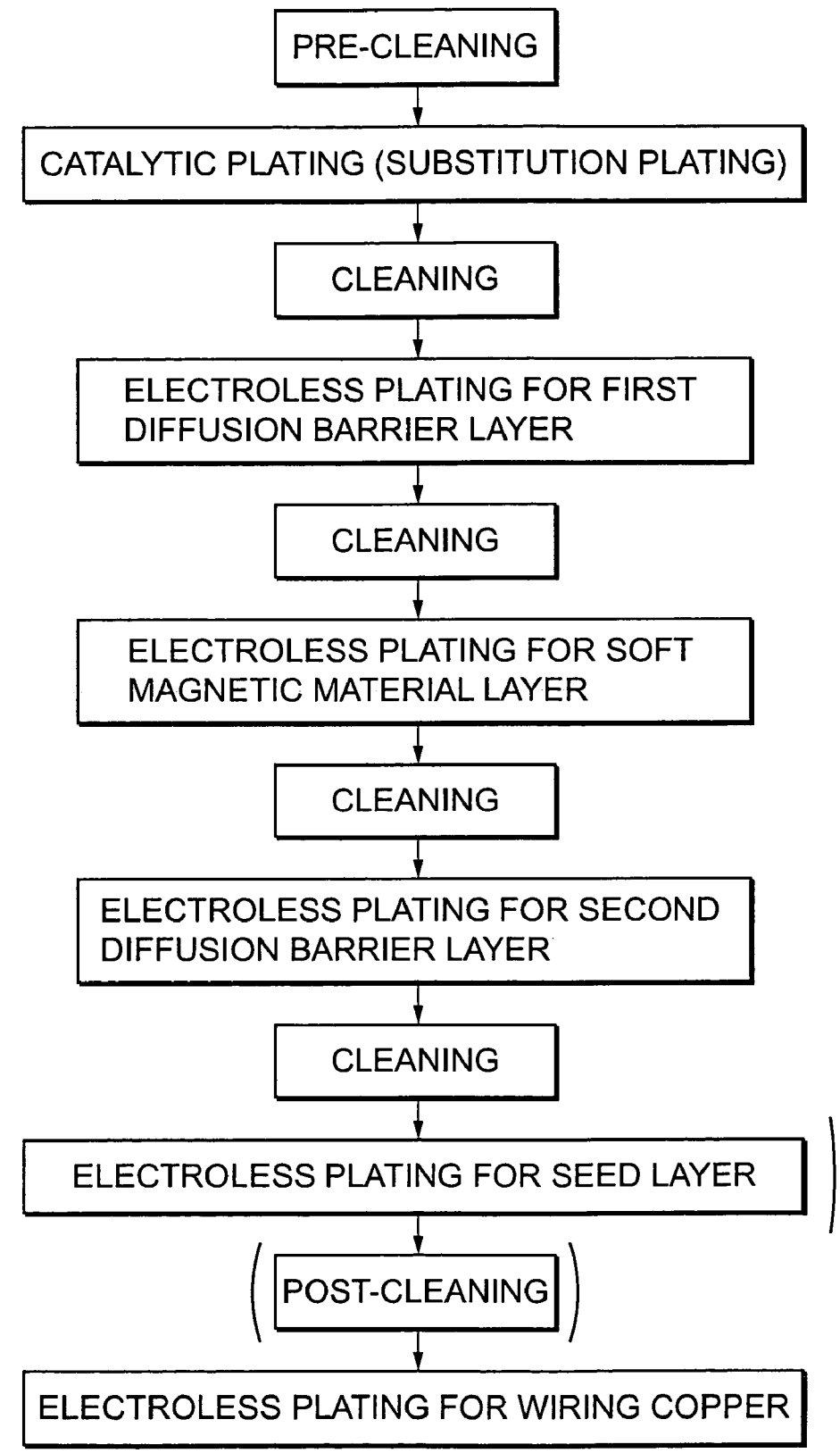
FIG. 14 shows a flowchart of a plating process in the second preferred embodiment of the present invention.

FIGS. 12 to 14 show a second preferred embodiment of the present invention.

In the conventional technique already described, main steps include three steps: sputtering→electro-plating→chemical mechanical polishing, but the above first preferred embodiment of the present invention requires the following main five steps: sputtering→electroless plating→sputtering→electro-plating→chemical mechanical polishing.

The present preferred embodiment of the present invention solves this problem, and all the barrier metal layer, the soft magnetic material layer, the seed copper layer, and the wiring copper layer constituting the cladding wiring are deposited by an electroless plating method, and one example is described with reference to FIGS. 12A to 13D. A flow of the steps is shown in FIG. 14.

First, as shown in FIG. 12A, on a substrate (not shown) having a transistor formed, a wiring trench 70 to be plugged with a word line and a read-out line (wherein a signal line and a sense line are not distinguished) positioned under a TMR element is formed by depositing an insulating layer 71 and processing it by lithography and dry etching. Then, a sidewall 74 and a bottom surface 73 of the wiring trench 70 and a surface 44 of the insulating layer 71, excluding the wiring trench 70, which constitutes a field portion 75, are subjected to cleaning as a pretreatment. The main purpose of the cleaning is removal of foreign matter, such as particles, and removal of a surface oxide film of the underlying metal material.

Then, as shown in FIG. 12B, for depositing the below-mentioned first diffusion barrier layer by electroless plating, formation of an adhesion layer and formation of a catalyst 141 are conducted. As a general method for forming them, a catalyst forming method using tin (Sn), palladium (Pd) is used. For improving the adhesion, a treatment with a coupling agent before forming the catalyst 141 is effective, but it may be performed if necessary. After the treatment, the catalyst chemical solution and the coupling agent chemical solution (when used) are washed away with pure water.

Then, as shown in FIG. 12C, a first diffusion barrier layer 142 is formed by electroless plating. It is effective that the first diffusion barrier layer 142 is formed from a film including cobalt. As an example, there can be mentioned cobalt-tungsten-phosphorus (Co—W—P) obtained by adding tungsten and the like to cobalt, and the detailed description of this is shown in p. 90-91 of "ADMETA (Advanced Metallization Conference) 2001, Abstracts of Asian Session, US Session Edition".

Then, the plating solution adhering to the surface is satisfactorily washed away with pure water or an acid or alkaline solution which does not remove the first diffusion barrier layer 142.

Next, as shown in FIG. 12D, a soft magnetic material layer 143 including the above-mentioned nickel-iron-boron or the like is formed by electroless plating. In this case, the cobalt-tungsten-phosphorus constituting the underlying first diffusion barrier layer 142 has an autocatalytic ability, and therefore the soft magnetic material layer 143 can be formed without adding a catalyst. When the soft magnetic material layer 143 is unlikely to be deposited, the catalytic displacement plating mentioned above with reference to FIG. 1D may be conducted, but, as seen in FIG. 9, the catalytic displacement plating solution has very high acidity, and therefore there is a need to take care in preventing the cobalt-tungsten-phosphorus of the first diffusion barrier layer 142 from being etched.

Then, the plating solution adhering to the surface is satisfactorily washed away with pure water or an acid or alkaline solution which does not remove the soft magnetic material layer 143.

Then, as shown in FIG. 13A, a second diffusion barrier layer 146 is formed by electroless plating. In this case, the nickel-iron-boron or the like constituting the underlying soft magnetic material layer 143 has an autocatalytic ability, and therefore there is no need to add a catalyst, but, when the second diffusion barrier layer 146 is unlikely to be deposited, the catalytic displacement plating mentioned above with reference to FIG. 1D may be conducted. The catalytic displacement plating solution is a strong acid, and therefore there is a need to take enormous care in preventing the soft magnetic material layer 143 from being etched. In deposition of the second diffusion barrier layer 146, electroless plating of cobalt-tungsten-phosphorus mentioned above as a representative example of the constituent material for the first diffusion barrier layer 142 can be used.

Then, the plating solution adhering to the surface is satisfactorily washed away with pure water or an acid or alkaline solution which does not remove the second diffusion barrier layer 146.

Then, the wiring trench 70 is plugged with a wiring material by electroless plating. As the wiring material, copper is generally used, and plugging with copper is described here.

Specifically, as shown in FIG. 13B, a copper layer 151A is deposited on the entire surface by electroless plating. In this case, cobalt (Co) as a constituent material ingredient of the second diffusion barrier layer 146 has also an autocatalytic ability and therefore, basically, there is no need to add a catalyst, but deposition of copper may be difficult depending on the chemical solution used or conditions for the electroless plating of copper. In this case, a method of addition of the catalyst 141 shown in FIG. 12B above or addition of the catalyst shown in FIG. 1D above can deal with that problem.

Next, as shown in FIG. 13C, excess copper (Cu) of the copper (Cu) layer 151A deposited on the portion excluding the wiring portion is removed, and then, the excess wiring material 151A, second diffusion barrier layer 146, soft magnetic material layer 143, first diffusion barrier layer 142, and catalyst 141 on the insulating layer 71 are successively removed by a chemical mechanical polishing (CMP) method so that the wiring materials remain in the wiring trench 70. Thus, the wiring trench 70 is plugged with a word line 152 and a read-out line 153 so that the wiring materials 151, 161, the second diffusion barrier layer 146, the soft magnetic material layer 143, the first diffusion barrier layer 142, the catalyst 141, and the like remain in the wiring trench 70, while planarizing the surface.

Then, after the steps shown in FIGS. 3A to 5C, on a catalyst 181, a first diffusion barrier layer 163 for bit line, a soft magnetic material layer 173, a second diffusion barrier layer 176, and a copper layer 187 are individually formed by the above-described electroless plating in the same manner as in the steps shown in FIGS. 12B to (6), and, on a catalyst 190 on the copper layer 187, a diffusion barrier layer 169 and a soft magnetic material layer 191 are individually formed by the above-described electroless plating. Consequently, as shown in FIG. 13D, an MRAM (TMR) element having the word line 152, read-out line 153, and bit line 182, in which a copper layer, a soft magnetic material layer, and diffusion preventing layers, and the like are buried, and having the same structure as that mentioned in FIG. 5C can be prepared by a damascene method.

In the present preferred embodiment of the present invention, as described above, the soft magnetic material layers 143, 173, 191 and diffusion barrier layers 142, 146, 163, 169, 176 constituting the cladding structure of the word line 152 and bit line 182 are formed by electroless plating, and therefore the soft magnetic material layers 143, 173, 191 can be formed around the main wirings 151, 187 (especially copper) of the word line 152 and bit line 182 so that the soft magnetic material layers individually have a uniform, satisfactory thickness. Thus, an induced magnetic field generated at the word line 152 and bit line 182 can be efficiently introduced to the memory element 10. In addition, like in the above first preferred embodiment of the present invention, both the improvement of the storage sensitivity of the MRAM and the reduction of power consumption can be achieved, and a wiring having low resistance and high reliability can be stably formed in a shorter time, and further the soft magnetic material layers 143, 173 and diffusion barrier layers 142, 146, 163, 176 each having a high resistance to chemical mechanical polishing (CMP)(hard to polish) and having a small thickness can be formed. Therefore, the time required for removing the unnecessary soft magnetic material layer and diffusion barrier layer by polishing can be further shortened.

In addition, all the barrier metal layers 142, 146, 163, 169, 176, the soft magnetic material layers 143, 173, 191, and the copper layers 151, 161, 187 for wiring constituting the cladding wiring are deposited by an electroless plating method, and hence the number of the steps can be reduced.

Third Preferred Embodiment of the Present Invention

Figure 15:
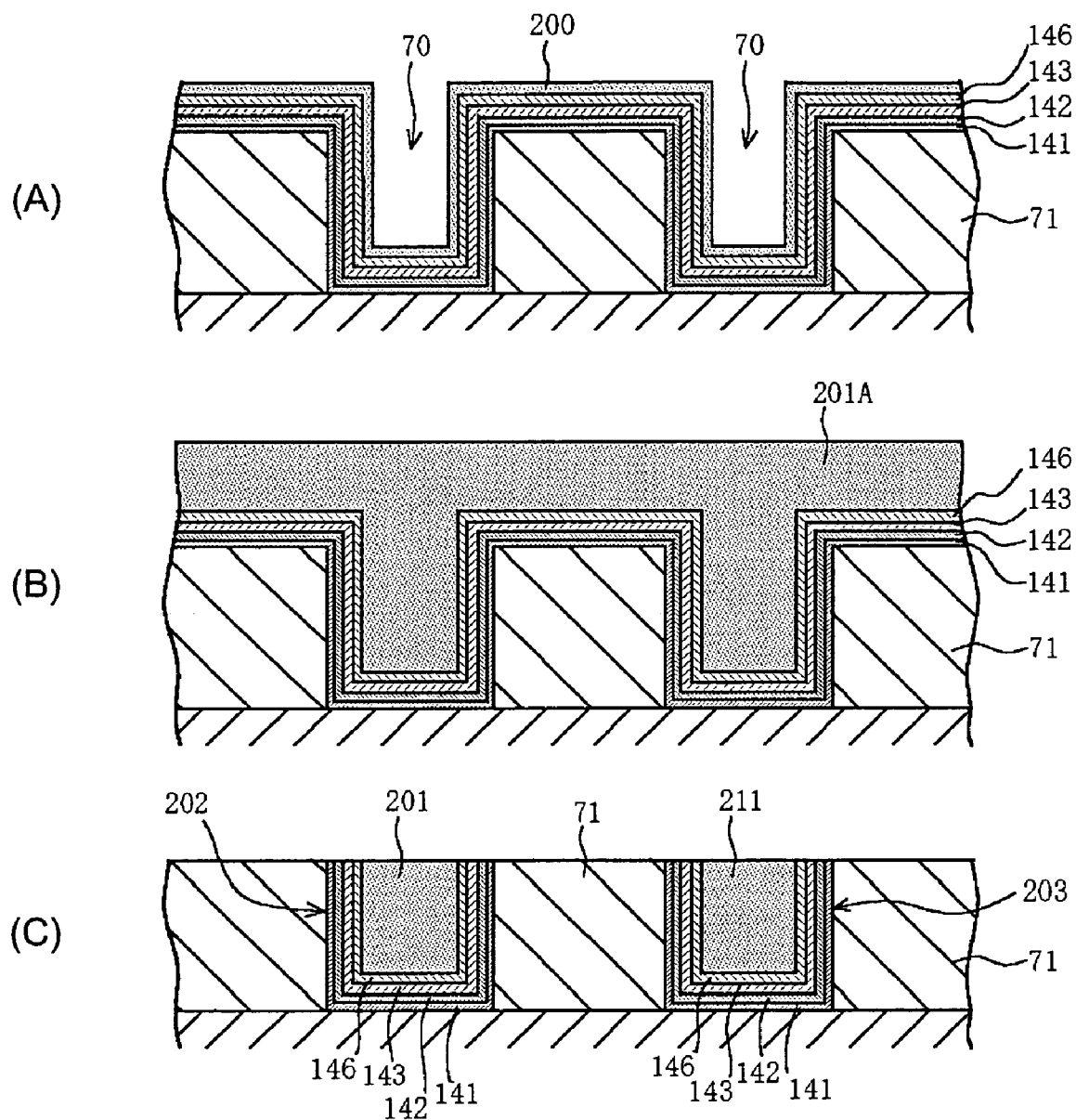
FIG. 15A to 15C shows cross-sectional views illustrating successive steps in a process for preparing an MRAM according to a third preferred embodiment of the present invention.
Figure 16:
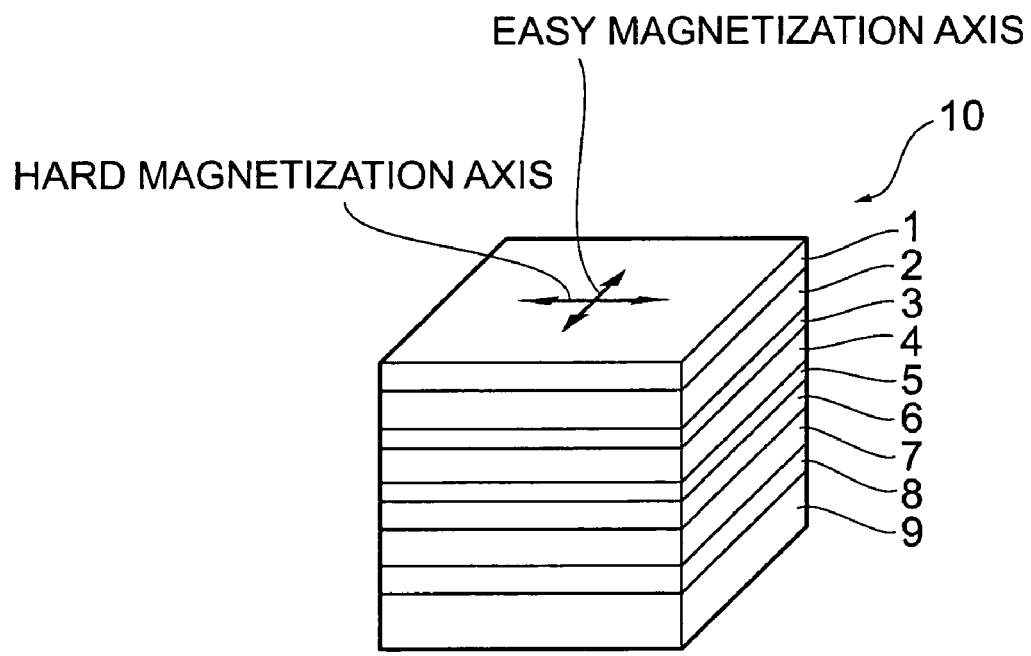
FIG. 16 shows a schematic perspective view of a TMR element of an MRAM.
Figure 17:
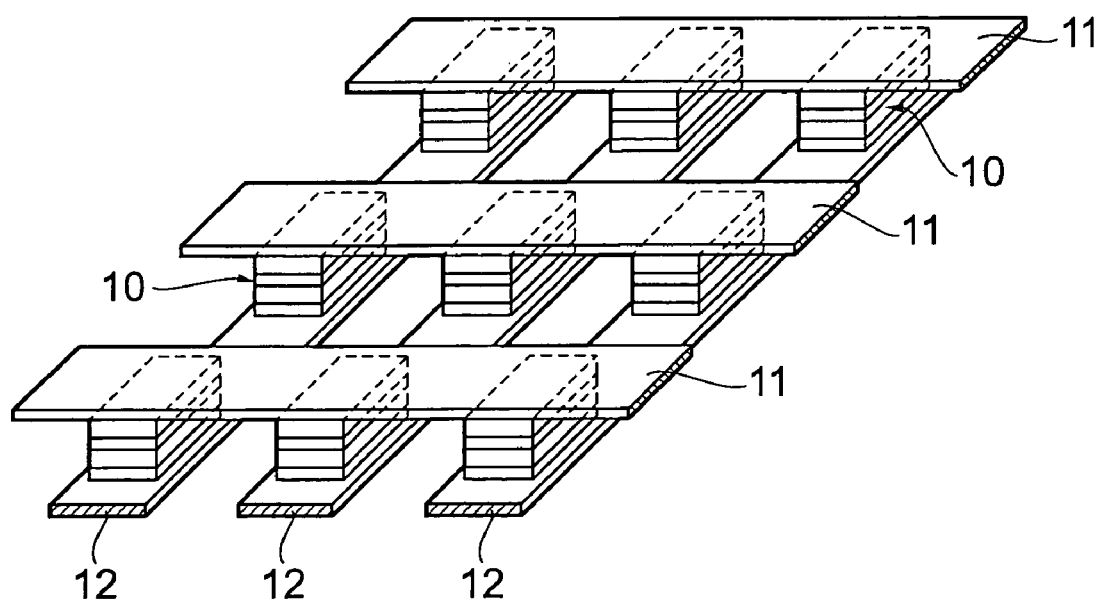
FIG. 17 shows a schematic perspective view of part of a memory cell portion of an MRAM.
Figure 18:
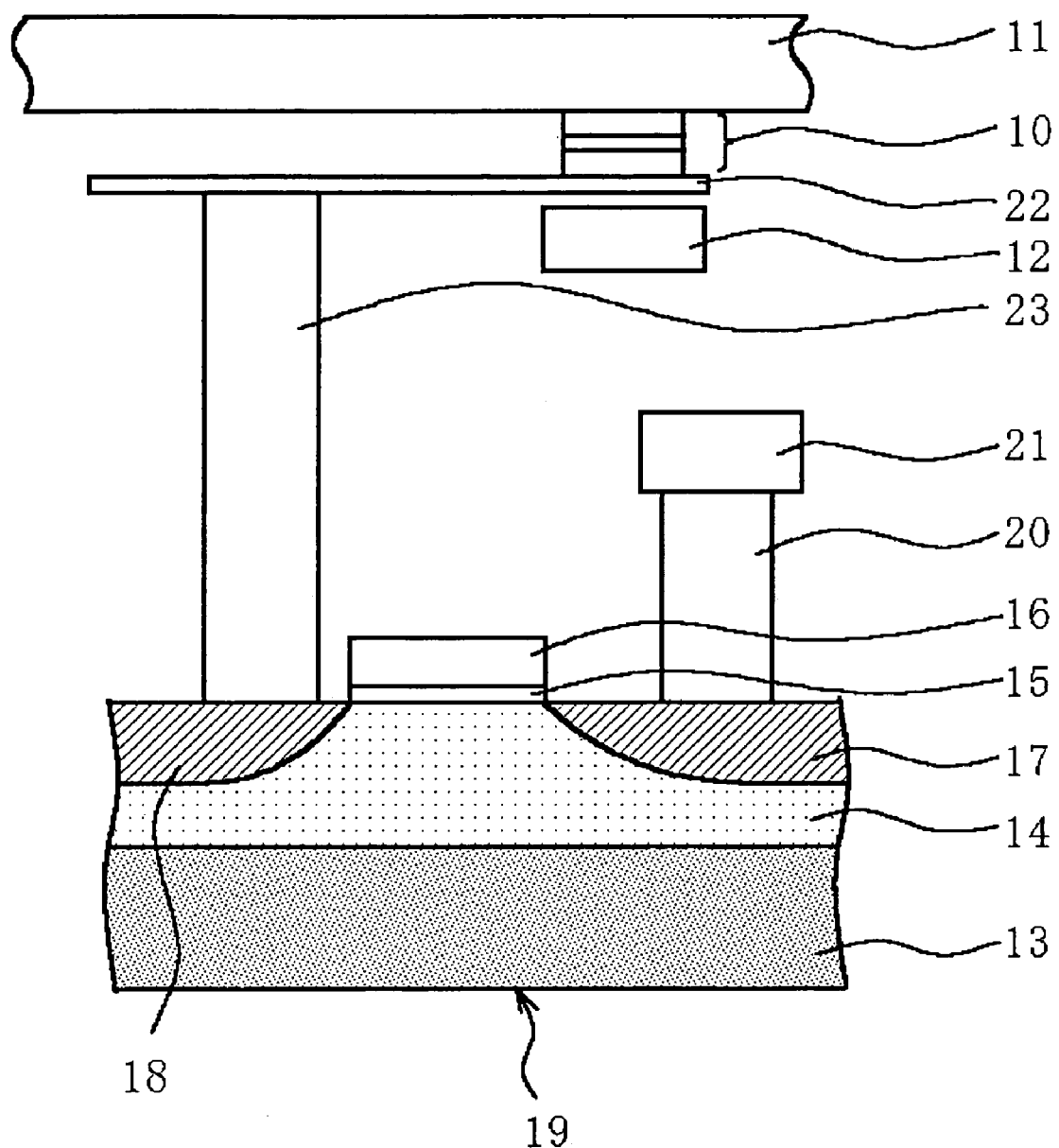
FIG. 18 shows a schematic cross-sectional view of a memory cell of an MRAM.
Figure 19:
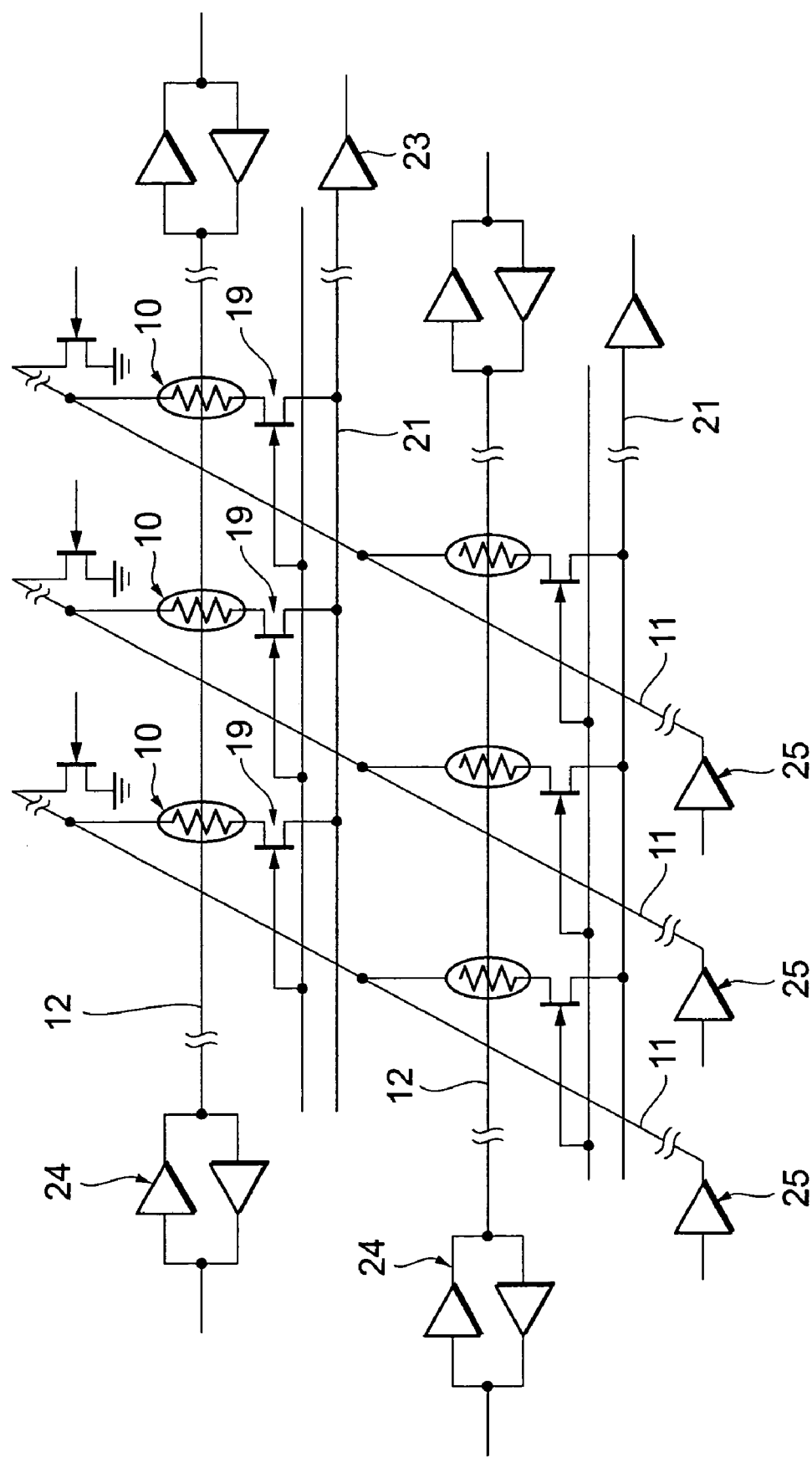
FIG. 19 shows an equivalent circuit diagram of an MRAM.
Figure 20:
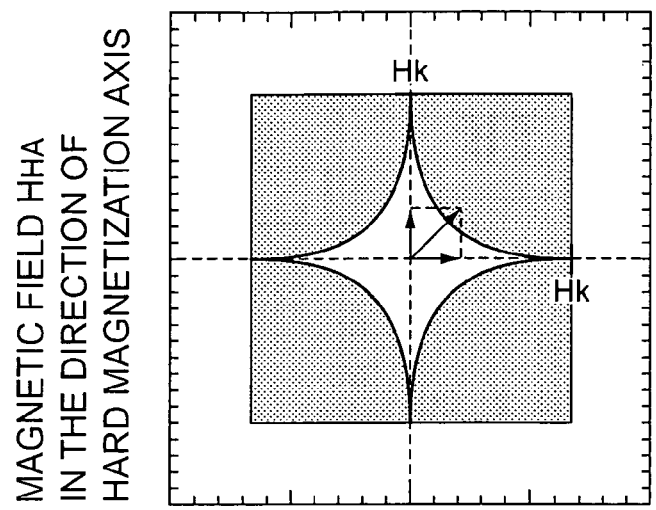
FIG. 20 shows a diagram showing the magnetic field response properties upon writing on an MRAM.
Figure 21:
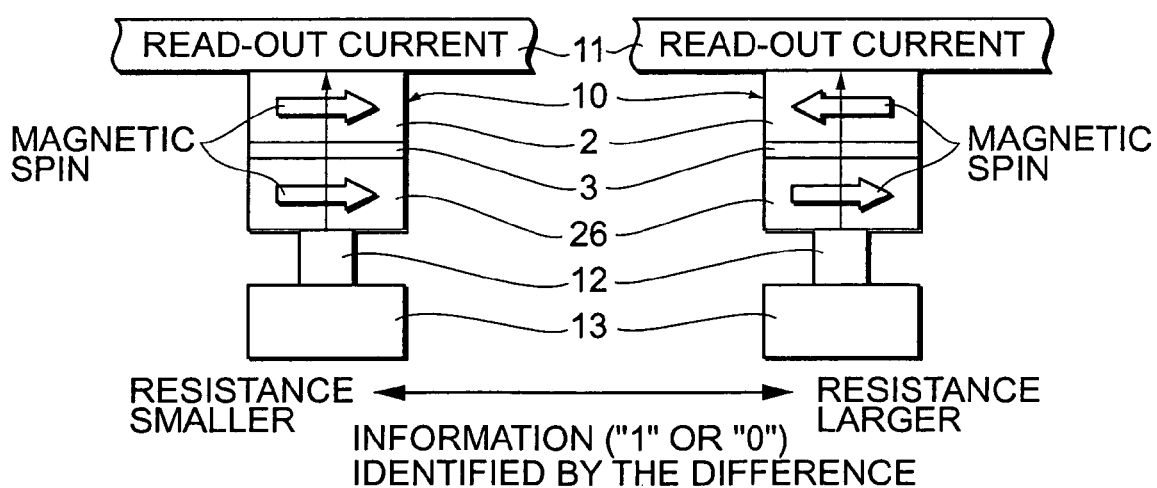
FIG. 21 shows a diagram showing the principle of read-out operation of an MRAM.

FIG. 15 shows a third preferred embodiment of the present invention.

In the above second preferred embodiment of the present invention, a process in which, for example, the diffusion barrier layer 142, the soft magnetic material layer 143, and the copper (Cu) layer 151A are successively deposited by electroless plating is performed, and, in this process, the electroless plating for the copper layer 151A as a wiring material determines the throughput. The thickness of each of the diffusion barrier layer 142 and the soft magnetic material layer 143 is 30 nm or less at most, whereas, the thickness of the wiring material copper layer 151A, although varies depending on the size of the wiring trench 70, must be two times or more the thickness of the diffusion barrier layer 142 and the soft magnetic material layer 143, and the deposition rate of the wiring material copper layer 151A by electroless plating is at most 1 µm/hr, which is smaller than the deposition rate of the diffusion barrier layer 142 and the soft magnetic material layer 143. In this case, a machine in a batch mode can be used, and hence there is no need to take care for the throughput, but the process is inefficient in the production of high-end products in a small amount.

The present preferred embodiment of the present invention solves this problem, and, first, as shown in FIG. 15A, a second diffusion barrier layer 146 is formed through the steps shown in FIGS. 12A to 13A, and then a seed layer 200 including copper is deposited by electroless plating. The seed layer 200 is an undercoat for the below-described plugging a wiring trench 70 with copper by electro-plating or CVD. The thickness of the seed layer 200 may be 30 to 100 nm, and the deposition method therefor is similar to that for the above wiring material copper 151A, and the thickness may be adjusted by controlling the deposition time.

Then, as shown in FIG. 15B, a copper layer 201A is deposited by electro-plating or CVD using the seed layer 200 as an undercoat, and buried in the wiring trench 70 by the below-mentioned method so that the form of cross-section is the same as that obtained in the plugging by the electroless plating shown in FIG. 12(6). The roles of the seed layer 200 are generation of a growth nucleus and electrical conduction as an electrode in the plugging by electroplating, and generation of a growth nucleus in the plugging by CVD.

As shown in FIG. 15C, for plugging the wiring trench 70 with wiring materials 201, 211, the excess wiring material (including the seed layer 200) 201A, first diffusion barrier layer 146, and the like on the insulating layer 71 are removed by chemical mechanical polishing (CMP) so that the wiring materials 201, 211, the second diffusion barrier layer 146, the soft magnetic material layer 143, the first diffusion barrier layer 142, and the like remain in the wiring trench 70 to form a word line 202 and a read-out line 203, while planarizing the surface.

Then, an MRAM is manufactured through the above-described steps (a copper layer for bit line is formed by electroplating or CVD, which is not shown).

In the present preferred embodiment of the present invention, the copper layer 201A as a wiring material for the word line (and the copper layer for the bit line) is deposited by electro plating or CVD instead of electroless plating and therefore, the deposition rate becomes relatively high as compared to that in the above second preferred embodiment of the present invention, and the collective throughput can be improved, so that the process becomes efficient in the production of high-end products in small amounts. The other effects which are the same as those mentioned above in connection with the second preferred embodiment of the present invention can be obtained.

It is to be observed that the present invention is not limited to the above-mentioned examples of preferred embodiments, which are merely descriptions of the present invention in its preferred form under a certain degree of particularity. It should be understood that they are by no means to be construed so as to limiting the scope of the present invention. It is therefore to be understood to those of ordinary skill in the art that many other changes, variations, combinations, sub-combinations and the like are possible therein without departing from the scope and spirit of the present invention.

For example, the element structure and layer construction of the MRAM and the constituent materials for the individual layers and the method for forming the layers may be changed or modified within the scope of the technical concept of the present invention. The above-mentioned read-out line preferably has the same structure as that of the word line, but it may have other structures so that, for example, the functionality is not affected even if the soft magnetic material layer or the like is omitted. At least a soft magnetic material layer of any one of either the above word line or the bit line may be formed by electroless plating.

The present invention is presented preferably as an MRAM, but its concept can be applied to other magnetic storage devices including a memory element having a magnetic layer which can be magnetized, and the MRAM of the present invention can be used as a ROM by fixing the direction of magnetization.

What is claimed is:

1. A nonvolatile magnetic memory device comprising:
a first wiring;
a magnetoresistive memory element including a tunnel insulating layer interposed between ferromagnetic materials and electrically insulated from said first wiring by a first insulating layer;
a second insulating layer covering said memory element; and
a second wiring electrically connected to said memory element and buried in said second insulating layer, said second wiring spatially crossing said first wiring with said memory element in between;
wherein said first wiring and said second wiring are buried in a trench formed in an insulating layer,
wherein at least a soft magnetic material layer and a diffusion barrier layer are formed in said trench at each outer periphery portion of said first wiring and said second wiring, wherein at least said diffusion barrier layer and said soft magnetic material layer are formed by electroless plating,
wherein at least said diffusion barrier layer has a uniform thickness,
wherein the at least soft magnetic layer includes a catalyst, and
wherein said trench is one quarter of a micron in width or less and is one quarter of a micron in depth or less, the diffusion barrier layer has a diffusion barrier layer thickness of at least several nanometers and the soft magnetic material layer has a soft magnetic material layer thickness of least several tens of nanometers.

2. The magnetic memory device according to claim 1, wherein the buried conductor of said first wiring and/or said second wiring, said soft magnetic material layer, and said diffusion barrier layer are individually formed by electroless plating,
whereby the buried conductor of said first wiring and/or said second wiring, said soft magnetic material layer, and said diffusion barrier layer each respectively have a uniform thickness.

3. The magnetic memory device according to claim 1, wherein the buried conductors of said first wiring and said second wiring comprise copper or copper alloy.

4. The magnetic memory device according to claim 1, further comprising a magnetic random access memory wherein information-writing is performed by magnetizing a storage layer of said memory element in a predetermined direction by means of a magnetic field induced by electric current applied individually to said first wiring and said second wiring; and the written information is read by tunnel magnetoresistance effect via said tunnel insulating layer.

* * * * *